(12) United States Patent
Ohmori et al.

(10) Patent No.: US 11,195,989 B2
(45) Date of Patent: Dec. 7, 2021

(54) FERROMAGNETIC TUNNEL JUNCTION ELEMENT AND METHOD OF MANUFACTURING THE SAME

(71) Applicant: SONY SEMICONDUCTOR SOLUTIONS CORPORATION, Kanagawa (JP)

(72) Inventors: Hiroyuki Ohmori, Kanagawa (JP); Masanori Hosomi, Tokyo (JP); Yutaka Higo, Kanagawa (JP); Hiroyuki Uchida, Kanagawa (JP); Naoki Hase, Tokyo (JP); Yo Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 56 days.

(21) Appl. No.: 16/490,132

(22) PCT Filed: Dec. 26, 2017

(86) PCT No.: PCT/JP2017/046696
§ 371 (c)(1),
(2) Date: Aug. 30, 2019

(87) PCT Pub. No.: WO2018/163575
PCT Pub. Date: Sep. 13, 2018

(65) Prior Publication Data
US 2020/0075842 A1 Mar. 5, 2020

(30) Foreign Application Priority Data
Mar. 9, 2017 (JP) .............................. JP2017-044677

(51) Int. Cl.
*H01L 43/02* (2006.01)
*H01L 43/10* (2006.01)
(Continued)

(52) U.S. Cl.
CPC .............. *H01L 43/02* (2013.01); *H01L 43/08* (2013.01); *H01L 43/10* (2013.01); *H01L 43/12* (2013.01)

(58) Field of Classification Search
CPC . H01L 27/22–224; H01L 43/02; H01L 43/08; H01L 43/10; H01L 43/12
See application file for complete search history.

(56) References Cited

U.S. PATENT DOCUMENTS

2004/0188732 A1* 9/2004 Fukuzumi ............ H01L 27/228
257/295
2005/0185459 A1 8/2005 Fukuzumi
(Continued)

FOREIGN PATENT DOCUMENTS

| CN | 1542844 A | 11/2004 |
|---|---|---|
| CN | 102272964 A | 12/2011 |

(Continued)

OTHER PUBLICATIONS

International Search Report and Written Opinion of PCT Application No. PCT/JP2017/046696, dated Feb. 20, 2018, 14 pages of ISRWO.

(Continued)

*Primary Examiner* — Robert G Bachner
*Assistant Examiner* — Molly K Reida
(74) *Attorney, Agent, or Firm* — Chip Law Group

(57) ABSTRACT

The present disclosure is to provide a ferromagnetic tunnel junction element and a method of manufacturing the ferromagnetic tunnel junction element capable of avoiding changes in the characteristics of the element and maintaining a high fabrication yield, while avoiding an increase in the area occupied by the element and an increase in the number of manufacturing steps. The ferromagnetic tunnel junction element to be provided includes: a first magnetic layer; a first (Continued)

insulating layer disposed on the first magnetic layer; a second magnetic layer containing a magnetic transition metal, the second magnetic layer being disposed on the first insulating layer; and a magnesium oxide film containing the magnetic transition metal, the magnesium oxide film being disposed to cover the side surfaces of the second magnetic layer.

11 Claims, 13 Drawing Sheets

(51) Int. Cl.
    *H01L 43/12*    (2006.01)
    *H01L 43/08*    (2006.01)

(56) References Cited

U.S. PATENT DOCUMENTS

| | | |
|---|---|---|
| 2007/0007569 A1 | 1/2007 | Fukuzumi |
| 2008/0284325 A1* | 11/2008 | Noh .................... H01L 51/0052 313/504 |
| 2010/0117169 A1 | 5/2010 | Anderson et al. |
| 2011/0235217 A1 | 9/2011 | Chen et al. |
| 2012/0061783 A1 | 3/2012 | Anderson et al. |
| 2013/0001652 A1 | 1/2013 | Yoshikawa et al. |

FOREIGN PATENT DOCUMENTS

| | | |
|---|---|---|
| CN | 102823008 A | 12/2012 |
| EP | 1463110 A2 | 9/2004 |
| JP | 2004-349671 A | 12/2004 |
| JP | 2012-508471 A | 4/2012 |
| JP | 2013-016587 A | 1/2013 |
| JP | 2013-524515 A | 6/2013 |
| JP | 2014-241449 A | 12/2014 |
| JP | 2015-179694 A | 10/2015 |
| JP | 2016-164955 A | 9/2016 |
| WO | 2010/056721 A1 | 5/2010 |
| WO | 2011/123357 A1 | 10/2011 |

OTHER PUBLICATIONS

L. Berger, "Emission of Spin Waves by a Magnetic Multilayer Traversed by a Current", the American Physical Society, vol. 54, No. 13, Oct. 1, 1996, pp. 9353-9358.

J.C. Slonczewski, "Letter to the Editor Current-Driven Excitation of Magnetic Multilayers", Journal of Magnetism and Magnetic Material, vol. 159, No. 1-2, Jun. 1996, pp. L1-L7.

Slonczewski, et al., "Current-driven excitation of magnetic multilayers", Journal of magnetism and magnetic materials, Dec. 19, 1995, 07 pages.

Le Berger, "Emission of spin waves by a magnetic multilayer traversed by a current", Physical Review B, The American Physical Society, vol. 54, No. 13, Oct. 1, 1996, pp. 9353-9358.

\* cited by examiner

FERROMAGNETIC TUNNEL JUNCTION ELEMENT AND METHOD OF MANUFACTURING THE SAME

CROSS REFERENCE TO RELATED APPLICATIONS

This application is a U.S. National Phase of International Patent Application No. PCT/JP2017/046696 filed on Dec. 26, 2017, which claims priority benefit of Japanese Patent Application No. JP 2017-044677 filed in the Japan Patent Office on Mar. 9, 2017. Each of the above-referenced applications is hereby incorporated herein by reference in its entirety.

TECHNICAL FIELD

The present disclosure relates to a ferromagnetic tunnel junction element and a method of manufacturing the ferromagnetic tunnel junction element.

BACKGROUND ART

With the rapid development of various kinds of information devices ranging from large-capacity servers to mobile terminals, higher performance, such as higher integration, higher speed, and lower power consumption, is expected in the elements that constitute those information devices, such as memory and logical elements. Particularly, advances in nonvolatile semiconductor memories are remarkable. For example, flash memories as large-capacity file memories are spreading almost as widely as hard disk drives. Meanwhile, in consideration of future applications to code storage usage and working memories, various kinds of semiconductor memories such as ferroelectric random access memory (FeRAM), magnetic random access memory (MRAM), and phase-change random access memory (PCRAM) are being developed to replace NOR flash memory, dynamic random access memory (DRAM), and the like that are currently used for general purposes. Note that some of these memories have already been put into practical use.

MRAM, which is one of the above mentioned memories, stores information by utilizing the change in the electrical resistance caused by changing the magnetization state of the magnetic material of a magnetic storage element of the MRAM. Accordingly, the stored information can be read out by determining the resistance state of the magnetic storage element determined by a change in the magnetization state, or more specifically, the magnitude of the electrical resistance of the magnetic storage element. Such an MRAM is capable of high-speed operation, can be rewritten almost infinitely ($10^{15}$ or more times), and is highly reliable. Because of these facts, MRAMs are already used in fields such as industrial automation and aircrafts. In addition to that, MRAMs are expected to be further applied to code storage and working memory in the future, because of their high-speed operation and high reliability.

Further, among the MRAMs, an MRAM that reverses the magnetization of a magnetic material using spin torque magnetization reversal can consume less electric power and have a larger capacity while maintaining the above described advantages such as high-speed operation. Therefore, even greater expectations are placed on such MRAMs. Note that an MRAM utilizing such spin torque magnetization reversal is called a spin transfer torque-magnetic random access memory (STT-MRAM) (a spin injection MRAM).

Specifically, an STT-MRAM includes, as a magnetic storage element, a magnetic tunnel junction (MTJ) element that has two magnetic layers and an insulating layer interposed between these two magnetic layers. Note that an MTJ element is also called a tunneling magneto resistive (TMR) element. In addition, in a case where an MTJ element having such a stack structure is subjected to fine processing, it is difficult to maintain a high fabrication yield. More specifically, residues generated by the processing may adhere to the MTJ element, to cause electrical short-circuiting, which might lower the MTJ element fabrication yield. To counter this, Patent Documents 1 and 2 listed below propose methods for reducing such a decrease in yield.

Specifically, according to Patent Document 1 listed below, after an MTJ element is formed, a plasma treatment is performed on the MTJ element in a gas atmosphere containing carbon and oxygen, to remove the residues generated by processing. Further, according to Patent Document 1 listed below, after the above residues are removed, the side surfaces of the MTJ element are oxidized, so that an oxide film covering the side surfaces of the MTJ element is formed. In this manner, the unremoved residues are oxidized and insulated. Thus, short-circuiting is prevented. Meanwhile, according to Patent Document 2 listed below, for example, a protective film having a two-layer structure covering the side surfaces of an MTJ element is formed to prevent short-circuiting.

CITATION LIST

Patent Documents

Patent Document 1: Japanese Patent Application Laid-Open No. 2016-164955
Patent Document 2: Japanese Patent Application Laid-Open No. 2015-179694

NON-PATENT DOCUMENTS

Non-Patent Document 1: Physical Review b, 54, 9353 (1996)
Non-Patent Document 2: Journal of Magnetism and Magnetic Materials, 159, L1 (1996)

SUMMARY OF THE INVENTION

Problems to be Solved by the Invention

However, in a case where the side surfaces of an MTJ element are directly oxidized as disclosed in Patent Document 1, the magnetic characteristics of the MTJ element are likely to change, and such a change in characteristics is conspicuous particularly in minute MTJ elements. Further, in a case where a protective film having a two-layer structure covering the side surfaces of an MTJ element is formed as in Patent Document 2 listed above, the area occupied by the MTJ element on the substrate increases, and accordingly, the storage capacity per unit area becomes smaller. In addition to that, the formation of the protective film having a two-layer structure significantly increases the number of steps in the manufacturing process, leading to higher production costs.

Therefore, the present disclosure suggests a novel and improved ferromagnetic tunnel junction element and a method of manufacturing the ferromagnetic tunnel junction element capable of avoiding changes in the characteristics of the element and maintaining a high fabrication yield, while avoiding an increase in the area occupied by the element and an increase in the number of manufacturing steps.

Solutions to Problems

The present disclosure is to provide a ferromagnetic tunnel junction element that includes: a first magnetic layer; a first insulating layer disposed on the first magnetic layer; a second magnetic layer containing a magnetic transition metal, the second magnetic layer being disposed on the first insulating layer; and a magnesium oxide film containing the magnetic transition metal, the magnesium oxide film being disposed to cover the side surfaces of the second magnetic layer.

The present disclosure is also to provide a ferromagnetic tunnel junction element manufacturing method that includes: sequentially stacking a first magnetic layer, a first insulating layer, and a second magnetic layer containing a magnetic transition metal on a substrate; forming a plurality of columnar ferromagnetic tunnel junction elements by performing etching on the second magnetic layer; forming a metallic magnesium film on the side surfaces of the second magnetic layer, and forming a magnesium oxide film containing the magnetic transition metal by performing an oxidation treatment to oxidize the metallic magnesium film, the magnesium oxide film covering the side surfaces of the second magnetic layer.

Effects of the Invention

As described above, according to the present disclosure, it is possible to avoid changes in the characteristics of an element and maintain a high fabrication yield while avoiding an increase in the area occupied by the element and an increase in the number of manufacturing steps.

Note that the above described effect is not necessarily restrictive, and it is possible to achieve any one of the effects described in this specification together with the above mentioned effect or instead of the above mentioned effect, or it is possible to achieve other effects obvious from this specification.

MODES FOR CARRYING OUT THE INVENTION

Figure 1:
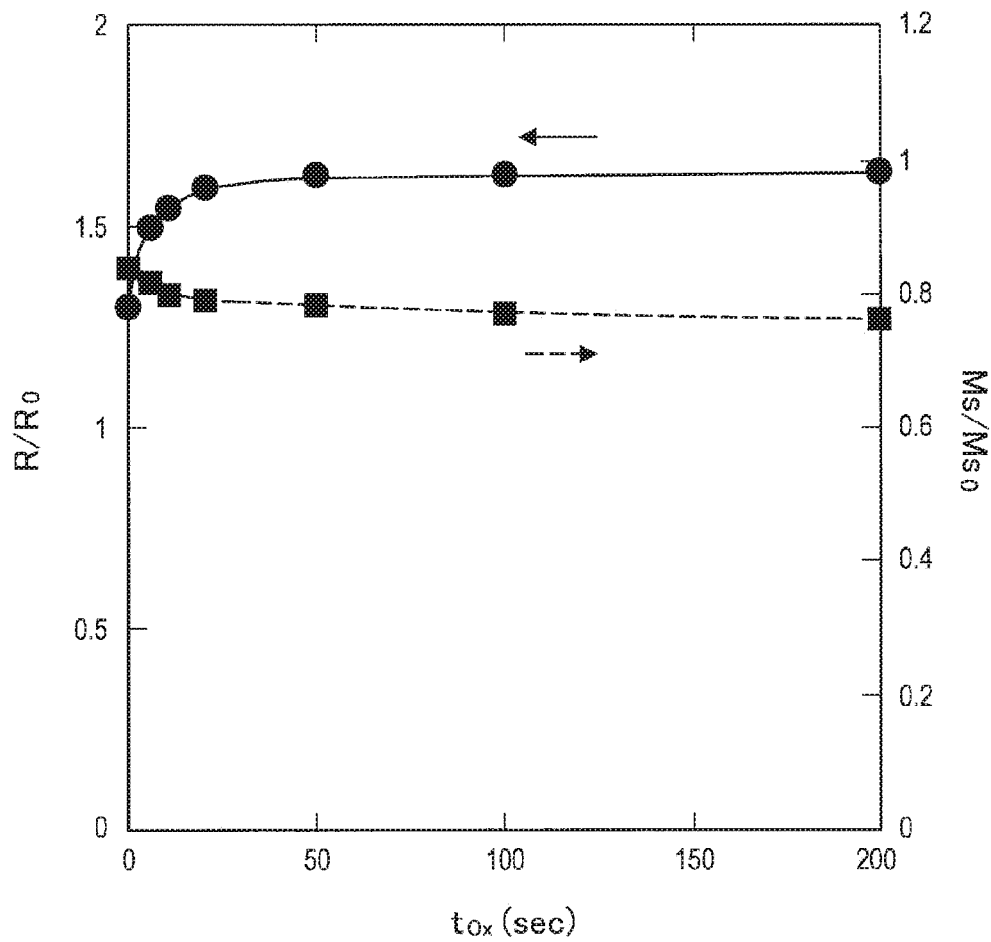
FIG. 1 is a graph (part 1) showing the resistance ratio ($R/R_0$) and the saturation magnetization ratio ($M_s/M_{s0}$) of a laminated film with respect to an oxidation treatment time ($T_{Ox}$), as obtained through examination conducted by the present inventors.

The following is a detailed description of preferred embodiments of the present disclosure, with reference to the accompanying drawings. Note that, in this specification and the drawings, components having substantially the same functional structures are denoted by the same reference numerals, and explanation of them will not be repeated.

Further, the drawings to be referred to in the description below are an explanation of one embodiment of the present disclosure and drawings for facilitating understanding thereof. For easier understanding, the shapes, the sizes, the ratios, and the like shown in the drawings might differ from those in practice. Furthermore, the elements and the like shown in the drawings can be appropriately designed and changed in consideration of the description below and known technologies. Moreover, in the description below, the vertical direction of the stack structure of the elements and the like corresponds to the relative direction in a case where the surface of the substrate on which the elements are provided faces upward, and might differ from the vertical direction depending on the actual gravity acceleration.

Note that explanation will be made in the following order.
1. Technical background relating to the present disclosure
1.1. Overview of an STT-MRAM
1.2. Method of manufacturing an MTJ element
1.3. Pro-oxidant effect of magnesium
2. One embodiment of the present disclosure
2.1. Structure of an MTJ element
2.2. Method of Manufacturing an MTJ element
3. Summary
4. Examples
5. Supplemental remarks «1. Technical Background Relating to the Present Disclosure»

<1.1. Overview of an STT-MRAM>

Before an embodiment of the present disclosure is described, the technical background of the present disclosure is first explained. The technology according to the present disclosure relates to a spin injection MRAM (STT-MRAM).

As described above, an MRAM that stores information according to the magnetization state of a magnetic material is capable of high-speed operation, can be rewritten almost infinitely ($10^{15}$ or more times), and is highly reliable. Therefore, such MRAMs are already used in various fields. Among such MRAMs, due to the magnetization reversal method, it is difficult to reduce the power consumption and increase the capacity of an MRAM that reverses the magnetization of a magnetic material at a current magnetic field generated from wiring lines. This is because, in an MRAM utilizing magnetization reversal using a current magnetic field from wiring lines, a current equal to or greater than a predetermined threshold value is necessary in generating a current magnetic field of a strength that can reverse the magnetization of the magnetic body, and the power consumption at a time of writing is likely to increase. Further, in an MRAM utilizing magnetization reversal using a current magnetic field from wiring lines, the wiring lines that generate the current magnetic field are provided for the respective magnetic storage elements, and therefore, there is a limit to miniaturization of magnetic storage elements.

In view of the above, an MRAM that reverses the magnetization of a magnetic material by a method that does not use a current magnetic field generated from wiring lines is being considered. More specifically, an STT-MRAM that reverses the magnetization of a magnetic material using spin torque magnetization reversal is being considered. An STT-MRAM has the advantages of an MRAM that is capable of high-speed operation and can be rewritten almost infinitely. Furthermore, an STT-MRAM can lower power consumption and have a larger capacity. Thus, great expectations are placed on such STT-MRAMs.

Specifically, an STT-MRAM includes, as a magnetic storage element, an MTJ element that has two magnetic layers and an insulating layer interposed between the two magnetic layers. The STT-MRAM utilizes a phenomenon in which, in the MTJ element, spin-polarized electrons passing through one magnetic layer (a pinned magnetization layer) whose magnetization direction is pinned in a certain direction give torque (called spin injection torque) to the other magnetic layer when entering the other magnetic layer (a free magnetization layer) having an unpinned magnetization direction. Specifically, a current equal to or higher than a threshold value is applied to the MTJ element, to give torque to the other magnetic layer. In this manner, the magnetization direction of the magnetic layer is reversed (magnetization reversal), and information is stored into the MTJ element. The absolute value of the current necessary to cause spin torque magnetization reversal as described above is 100 µA or smaller in an MTJ element of about 50 nm in scale. Further, the current value decreases as the volume of the MTJ element decreases. Accordingly, it is possible to reduce the current by scaling down the MTJ element. Furthermore, such an STT-MRAM also has an advantage that the cell structure can be simplified because any wiring line for generating a current magnetic field for storing information into the MTJ element is not necessary.

<1.2. Method of Manufacturing an MTJ Element>

Next, a method of manufacturing an MTJ element 90 (a method of manufacturing an MTJ element 90 according to a comparative example) that the present inventors have examined so far is described, with reference to FIGS. 12 through 16. FIGS. 12 through 16 are cross-sectional views for explaining the respective steps in the method of manufacturing the MTJ element 90 according to the comparative example. These cross-sectional views correspond to a cross-section in a case where the MTJ element 90 is cut along the stacking direction of the stack structure of the MTJ element 90. Note that, although the manufacturing method described below is explained as a manufacturing method according to a comparative example, one or more of the steps in the manufacturing method are shared with the later described manufacturing method according to an embodiment of the present disclosure.

Figure 12:
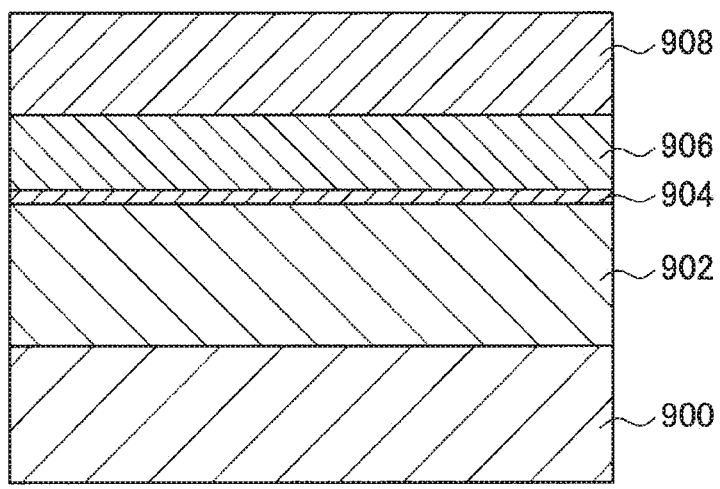
FIG. 12 is a cross-sectional view (part 1) for explaining each step in a method of manufacturing an MTJ element 90 according to a comparative example.

As shown in FIG. 12, in the method of manufacturing the MTJ element 90 according to the comparative example, a first magnetic layer 902, a tunnel barrier layer (an insulating layer) 904, a second magnetic layer 906, and a protective layer 908 are sequentially stacked on a substrate 900.

The first magnetic layer 902 and the second magnetic layer 906 are formed with a ferromagnetic material. The ferromagnetic material may be a magnetic material containing at least one magnetic transition metal element such as iron (Fe), cobalt (Co), nickel (Ni), and manganese (Mn). Alternatively, the magnetic material may contain at least one element selected between boron (B) and carbon (C). More specifically, the first and second magnetic layers 902 and 906 may be formed with a single material such as FeCoB, FeNiB, FeCoC, CoPt, FePt, CoMnSi, or MnAl, or may be formed with a combination of some of these materials. Further, the thickness of the first magnetic layer 902 is not smaller than 1 nm and not greater than 30 nm, for example, and the thickness of the second magnetic layer 906 is not smaller than 1 nm and not greater than 10 nm, for example.

The tunnel barrier layer 904 is formed with an insulating material such as $Al_2O_3$ or MgO, and a tunneling current depending on the magnetization states of the first magnetic layer 902 and the second magnetic layer 906 flows in the tunnel barrier layer 904. Note that the thickness of the tunnel barrier layer 904 is not smaller than 0.3 nm and not greater than 5 nm, for example.

The protective layer 908 is formed with a metal material, an alloy material, or the like of any appropriate kind. The protective layer 908 protects the respective stacked layers during the manufacture of the MTJ element 90.

Figure 13:
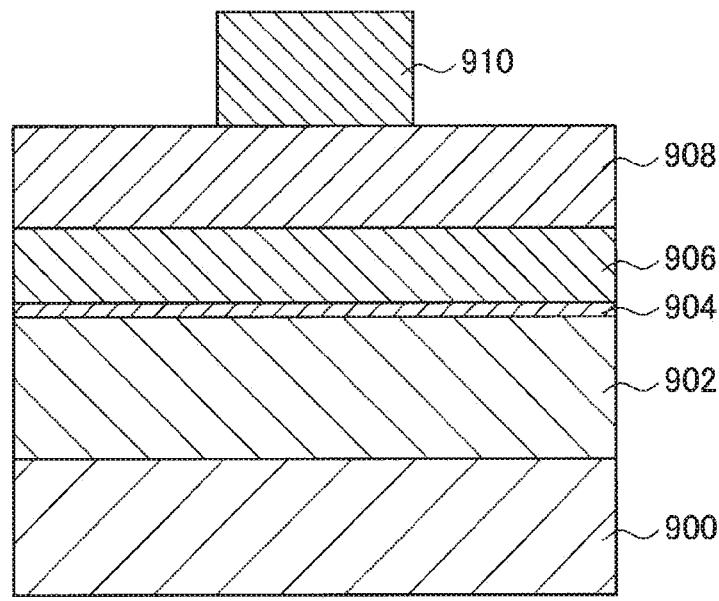
FIG. 13 is a cross-sectional view (part 2) for explaining each step in a method of manufacturing an MTJ element 90 according to a comparative example.

Next, as shown in FIG. 13, a photomask 910 having a pattern corresponding to the MTJ element 90 is formed on the protective layer 908.

Figure 14:
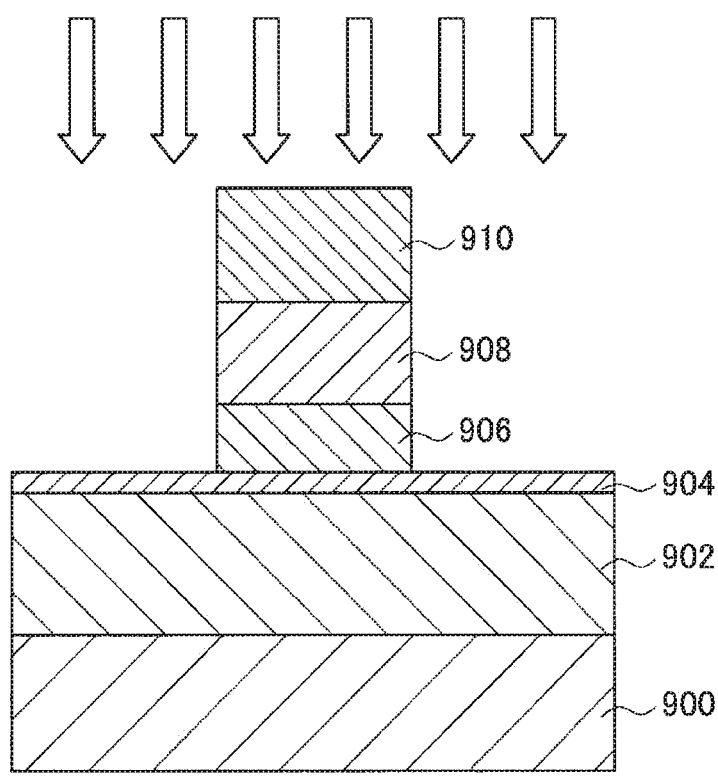
FIG. 14 is a cross-sectional view (part 3) for explaining each step in a method of manufacturing an MTJ element 90 according to a comparative example.

Further, as shown in FIG. 14, with the photomask 910 being used as a mask, etching is performed on the protective layer 908, the second magnetic layer 906, and the tunnel barrier layer 904, to form the MTJ element 90. The etching may be ion beam etching (IBE), reactive ion etching (RIE), or a combination thereof. Note that, in this step, etching may be performed on the protective layer 908, the second magnetic layer 906, the tunnel barrier layer 904, and the first magnetic layer 902.

Figure 15:
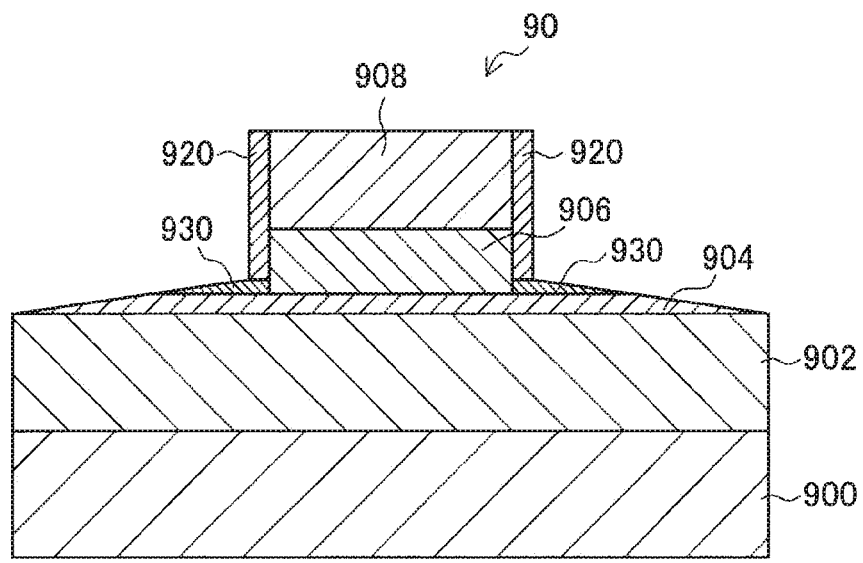
FIG. 15 is a cross-sectional view (part 4) for explaining each step in a method of manufacturing an MTJ element 90 according to a comparative example.
Figure 16:
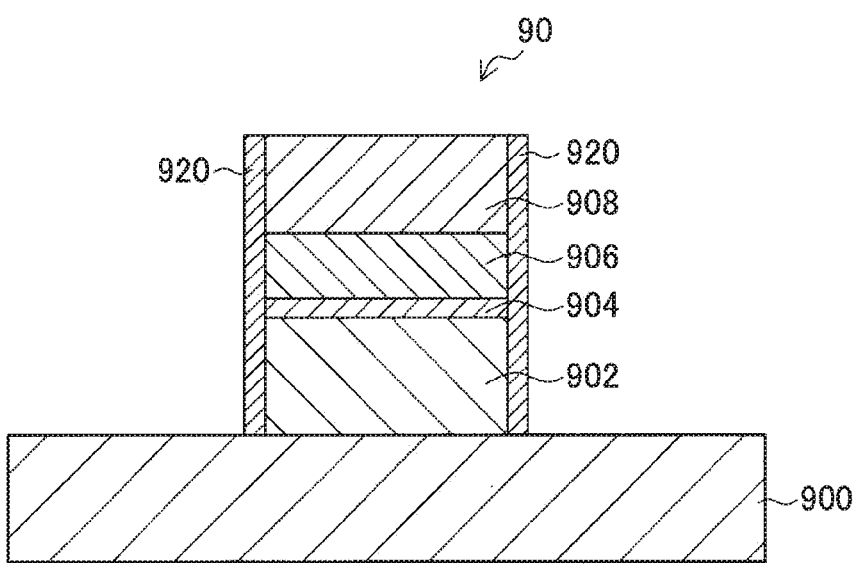
FIG. 16 is a cross-sectional view (part 5) for explaining each step in a method of manufacturing an MTJ element 90 according to a comparative example.

In a case where the MTJ element 90 is formed in this manner, a columnar MTJ element 90 in a state as shown in FIG. 15 or 16 can be obtained, for example. Specifically, FIG. 15 shows an example case where etching is performed to reach the tunnel barrier layer 904, and FIG. 16 shows an example case where etching is performed to reach the first magnetic layer 902.

As shown in FIG. 15, in a case where etching is performed to reach the tunnel barrier layer 904, etching residues 930 generated by the etching performed on the second magnetic layer 906 remain around the second magnetic layer 906 on the tunnel barrier layer 904. Because it is difficult to perform etching on the second magnetic layer 906 while completely removing the etching residues 930, the etching residues 930 remain around the second magnetic layer 906 as shown in FIG. 15. Since the etching residues 930 are derived from the second magnetic layer 906 subjected to the etching, the etching residues 930 contain components (Fe, Co, Ni, Mn, and the like, for example) that constitute the second magnetic layer 906. Therefore, the etching residues 930 remaining around the second magnetic layer 906 might affect the second magnetic layer 906 of the MTJ element 90, to degrade the magnetic characteristics such as the coercive force characteristics and the magnetoresistance ratio of the MTJ element 90. Also, as shown in FIG. 15, a re-adhering substance 920 including the residues generated by the processing performed so far re-adheres to the side surfaces of the MTJ element 90. Since the re-adhering substance 920 is also derived from the second magnetic layer 906, the protective layer 908, and the like subjected to etching, the re-adhering substance 920 contains the components constituting the second magnetic layer 906, the protective layer 908, and the like. Therefore, such a re-adhering substance 920 might also degrade the magnetic characteristics of the MTJ element 90.

Further, as shown in FIG. 16, in a case where etching is performed to reach a deep portion of the tunnel barrier layer 904, the re-adhering substance 920 might be deposited on the side surfaces of the tunnel barrier layer 904 in the thickness direction. In such a case, the re-adhering substance 920 might be conductive depending on the components contained therein, because the re-adhering substance 920 are derived from the second magnetic layer 906, the protective layer 908, and the like subjected to etching as described above. Therefore, in a case where the re-adhering substance 920 is deposited on the side surfaces of the tunnel barrier layer 904 in the thickness direction, the re-adhering substance 920 might electrically connect the first magnetic layer 902 and the second magnetic layer 906, or cause short-circuiting. As a result, the fabrication yield of MTJ elements 90 becomes lower.

Also, as shown in FIG. 16, in a case where etching is performed to reach the first magnetic layer 902, the etching residues 930 are less likely to remain around the second magnetic layer 906 than in the case illustrated in FIG. 15. However, the re-adhering substance 920 easily adheres to the side surfaces of the tunnel barrier layer 904 in the thickness direction. As described above, the re-adhering substance 920 may be conductive depending on the components contained therein. Therefore, as shown in FIG. 16, in a case where the re-adhering substance 920 is deposited on the side surfaces of the tunnel barrier layer 904 in the thickness direction, the re-adhering substance 920 electrically connects the first magnetic layer 902 and the second magnetic layer 906, and causes short-circuiting. As a result, the withstand voltage of the MTJ element 90 is lowered, and the fabrication yield is degraded. Further, in the example illustrated in FIG. 16, the re-adhering substance 920 re-adhering to the side surfaces of the MTJ element 90 might degrade the magnetic characteristics such as the coercive force characteristics and the magnetoresistance ratio of the MTJ element 90, as in the example illustrated in FIG. 15.

Figure 17:
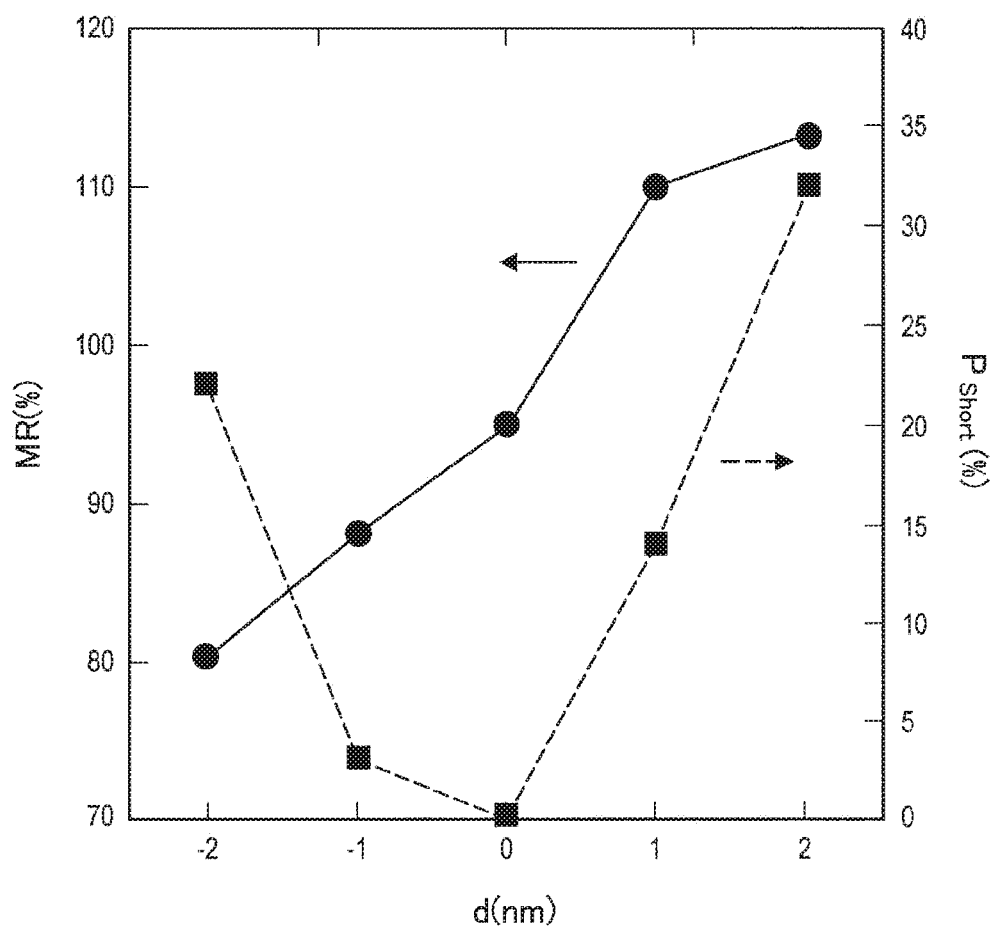
FIG. 17 is a graph showing the changes in the magnetoresistance ratio (MR (%)) of an MTJ element 90 and the occurrence rate ($P_{short}$ (%)) of short-circuiting at a time when the etching depth (d nm) around a tunnel barrier layer 904 was changed, as obtained through examination conducted by the present inventors.

In view of the above, the present inventors examined the relationship among the etching depth of the above described etching, the occurrence rate of short-circuiting in the MTJ element 90, and the magnetoresistance ratio. The results obtained through the examination are shown in FIG. 17. FIG. 17 is a graph showing the changes in the magnetoresistance ratio (MR (%)) of the MTJ element 90 and the occurrence rate ($P_{short}$ (%)) of short-circuiting at a time when the etching depth (d nm) around the tunnel barrier layer 904 was changed, as obtained through the examination conducted by the present inventors. In FIG. 17, the abscissa axis indicates the etching depth (d nm), the positive values showing the thickness of the portion of the tunnel barrier layer 904 subjected to etching, the negative values showing the thickness of the remaining portion of the tunnel barrier layer 904 not subjected to the etching. Moreover, as for the ordinate axis, the ordinate axis on the right side indicates the magnetoresistance ratio (MR (%)), and the ordinate axis on the left side indicates the short-circuiting occurrence rate ($P_{short}$ (%)). Note that the magnetoresistance ratio (MR) was measured by the current-in-plane-tunneling (CIPT) method using a 12-terminal probe. Meanwhile, the short-circuiting occurrence rate ($P_{short}$ (%)) was detected by measuring the conduction state between the first magnetic layer 902 and the second magnetic layer 906 of the MTJ element 90.

According to the graph shown in FIG. 17, as the etching on the tunnel barrier layer 904 was continued as shown in FIG. 16, the etching residues 930 of the second magnetic layer 906 became fewer, and the magnetoresistance ratio (MR (%)) became higher. However, it became easier for the re-adhering substance 920 to adhere to the portion surrounding the tunnel barrier layer 904, and the occurrence rate ($P_{short}$ (%)) of short-circuiting in the tunnel barrier layer 904 increased.

Also, according to the graph in FIG. 17, in a case where the tunnel barrier layer 904 is left as shown in FIG. 15, the occurrence rate ($P_{short}$ (%)) of short-circuiting in the tunnel barrier layer 904 increased. Further, as it became easier for the etching residues 930 of the second magnetic layer 906 to remain, the magnetoresistance ratio (MR (%)) of the MTJ element 90 became lower.

In other words, as can be seen from the graph in FIG. 17, in a case where the short-circuiting occurrence rate ($P_{short}$ (%)) is to be lowered while the magnetoresistance ratio (MR (%)) is increased, the amount of etching to be performed on the tunnel barrier layer 904 should be controlled with high precision. If the etching amount differs even slightly from the target etching amount, the short-circuiting occurrence rate ($P_{short}$ (%)) rapidly increases, and the magnetoresistance ratio (MR (%)) rapidly decreases. In other words, by controlling the amount of etching to be performed on the tunnel barrier layer 904, it is difficult to avoid short-circuiting and increase the fabrication yield, while preventing degradation of the magnetic characteristics of the MTJ element 90.

In view of the above, the present inventors have considered various measures to reduce the influence of the re-adhering substance 920 and the etching residues 930. More specifically, the present inventors considered a countermeasure to insulate the re-adhering substance 920 and the etching residues 930 and reduce short-circuiting by performing an oxidation treatment or the like after the formation of the MTJ element 90, as in Patent Document 1 described above.

Figure 18:
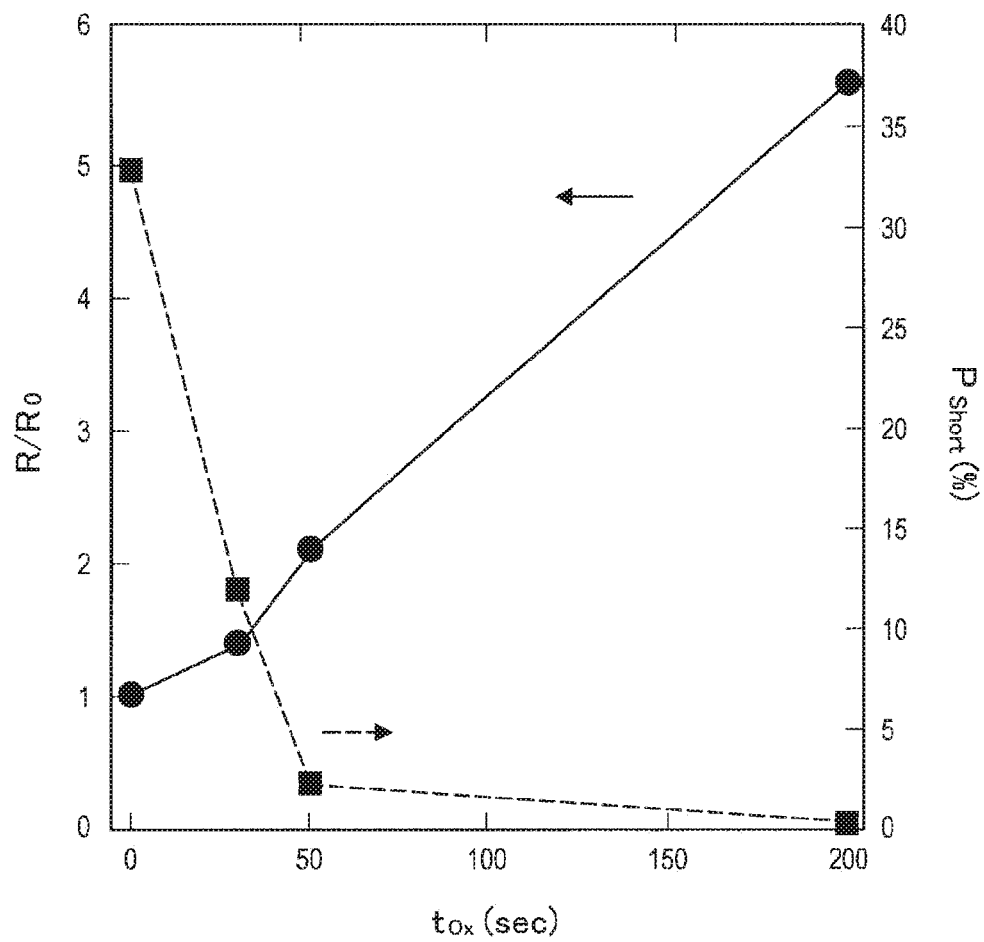
FIG. 18 is a graph showing the short-circuiting occurrence rate ($P_{short}$ (%)) and the element resistance ratio ($R/R_0$) of an MTJ element 90, with respect to the oxidation treatment time ($T_{Ox}$) after the formation of the MTJ element 90, as obtained through examination conducted by the present inventors.

However, the present inventors discovered that, if an oxidation treatment is performed, not only the re-adhering substance 920 and the etching residues 930 are oxidized, but also the magnetic layers 902 and 906, and the tunnel barrier layer 904 that constitute the MTJ element 90 are affected by the oxidation treatment. Referring now to FIG. 18, the above examination conducted by the present inventors is described. FIG. 18 is a graph showing the short-circuiting occurrence rate ($P_{short}$ (%)) and the element resistance ratio ($R/R_0$) of the MTJ element 90, with respect to the oxidation treatment time ($T_{Ox}$) after the formation of the MTJ element 90, as obtained through the examination conducted by the present inventors. Specifically, in FIG. 18, the abscissa axis indicates the oxidation treatment time ($T_{Ox}$), the ordinate axis on the left side indicates the element resistance ratio ($R/R_0$), and the ordinate axis on the right side indicates the short-circuiting occurrence rate ($P_{short}$ (%)). Note that the element resistance ratio ($R/R_0$) is shown as the ratio to the element resistance of a sample not subjected to the oxidation treatment. In addition to that, the diameter of the MTJ element 90 related to the sample measured herein is 60 nm. Further, the element resistance was measured by applying a predetermined pulse current to the MTJ element 90.

As shown in FIG. 18, in a case where the MTJ element 90 is simply subjected to the oxidation treatment, the short-circuiting occurrence rate ($P_{short}$ (%)) became lower, but the element resistance rapidly increased before the short-circuiting occurrence rate ($P_{short}$ (%)) became sufficiently low. Accordingly, it became clear from the examination conducted by the present inventors that it is difficult to find such conditions for the oxidation treatment as to reduce the short-circuiting occurrence rate ($P_{short}$ (%)) without changing the magnetic characteristics (the element resistance) of the MTJ element 90.

Next, since the re-adhering substance 920 and the etching residues 930 are derived from the second magnetic layer 906 of the MTJ element 90, the present inventors examined the changes in the characteristics caused by the oxidation treatment performed on the magnetic film including the same material as the second magnetic layer 906. Specifically, the present inventors formed a 1.5 nm thick magnetic film of FeCoB on a silicon substrate provided with a thermally oxidized film, and performed a plasma oxidation treatment on the magnetic film. Further, the electrical resistance and the saturation magnetization of the magnetic film were measured. Note that the electrical resistance was measured by a four-terminal method, and the saturation magnetization was measured with a vibrating sample magnetometer (VSM).

Figure 19:
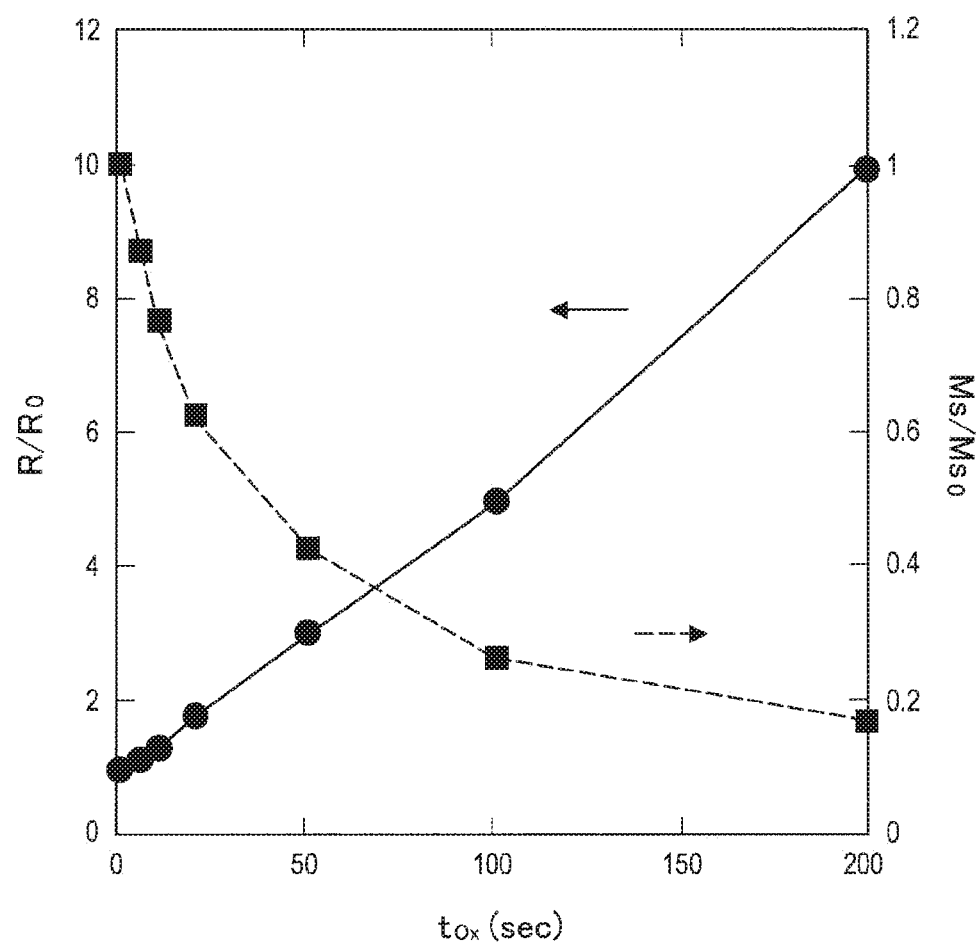
FIG. 19 is a graph showing the resistance ratio ($R/R_0$) and the saturation magnetization ratio ($M_s/M_{s0}$) of a magnetic film with respect to the oxidation treatment time ($T_{Ox}$), as obtained through examination conducted by the present inventors.

The results of the above measurement are shown in FIG. 19. FIG. 19 is a graph showing the resistance ratio ($R/R_0$) and the saturation magnetization ratio ($M_s/M_{s0}$) of the magnetic film with respect to the oxidation treatment time ($T_{Ox}$), as obtained through the examination conducted by the present inventors. Specifically, in FIG. 19, the abscissa axis indicates the oxidation treatment time ($T_{Ox}$), the ordinate axis on the left side indicates the resistance ratio ($R/R_0$), and the ordinate axis on the right side indicates the saturation magnetization ratio ($M_s/M_{s0}$). Note that the resistance ratio ($R/R_0$) and the saturation magnetization ratio ($M_s/M_{s0}$) are shown as the ratios to the resistance and saturation magnetization of a sample not subjected to the oxidation treatment. In addition to that, the diameter of the MTJ element 90 related to the sample measured herein is 60 nm.

As shown in FIG. 19, the resistance ratio ($R/R_0$) gradually increased with the increase in the oxidation treatment time ($T_{Ox}$), and the saturation magnetization ratio ($M_s/M_{s0}$) also gradually decreased with the increase in the oxidation treatment time. According to the present inventors, it became clear from the above that intense oxidation should be performed to oxidize the magnetic film without changing the characteristics thereof and thus insulate the magnetic film. If oxidation that sufficiently insulates the magnetic film is not performed, the re-adhering substance 920 and the etching residues 930 having components similar to those of the magnetic film maintain conductivity, and cause short-circuiting. Further, the re-adhering substance 920 and the etching residues 930 affect the first and second magnetic layers 902 and 906, and the tunnel barrier layer 904 of the MTJ element 90, and might become the cause of degradation of the magnetic characteristics such as the coercive force characteristics and the magnetoresistance ratio of the MTJ element 90.

However, in a case where the oxidation treatment is performed under such a condition that the re-adhering substance 920 and the etching residues 930 can be sufficiently oxidized, the second magnetic layer 906 is also oxidized at the same time, resulting in a change in the characteristics such as the saturation magnetization. In other words, it became apparent from the examination conducted by the present inventors that it is difficult to insulate the re-adhering substance 920 and the etching residues 930 by an oxidation treatment, without affecting the characteristics of the MTJ element 90.

Further, in a case where a protective film having a two-layer structure covering the side surfaces of the MTJ element 90 is formed, it is possible to avoid changes in the magnetic characteristics of the MTJ element 90 while avoiding short-circuiting, as in Patent Document 2 described above. In this case, however, the area occupied by the MTJ element 90 on the substrate increases, and therefore, the storage capacity per unit area becomes smaller. Furthermore, the formation of the protective film having a two-layer structure significantly increases the number of steps in the manufacturing process, leading to higher production costs. Therefore, the present inventors determined that there are many problems with the method of forming a protective film having a two-layer structure covering the side surfaces of the MTJ element 90 as in Patent Document 2 described above.

In view of such circumstances, the present inventors further made intensive studies on an MTJ element capable of avoiding short-circuiting or the like and maintaining a high fabrication yield, without affecting the characteristics of the MTJ element 90. While conducting the studies, the present inventors focused on the pro-oxidant effect of magnesium described below, and came to develop an embodiment of the present disclosure. In the description below, the phenomenon that the present inventors focused on will be described.

<1.3. Pro-Oxidant Effect of Magnesium>

Under the circumstances described above, the present inventors focused on the properties of magnesium (Mg). Magnesium is a metal element that is easily oxidized. Further, magnesium is likely to form a composite oxide with a magnetic transition metal such as Fe or Co contained in the re-adhering substance 920 and the etching residues 930. This is apparent from the fact that the Gibbs energy of formation of $MgFe_2O_4$, which is a composite oxide of Fe and Mg, is −1317 kJ/mol, while the Gibbs energy of formation of MgO, which is an oxide of Mg, is −569 kJ/mol, and the Gibbs energy of formation of $Fe_2O_3$, which is an oxide of Fe, is −742 kJ/mol.

Therefore, the present inventors conducted examination similar to the examination conducted to obtain the graph shown FIG. 19, using a metallic magnesium film, instead of a magnetic film of FeCoB. From the examination, it became clear that the metallic magnesium film is readily oxidized in the air, and turns into a nonconductive insulating film with a thickness of 1.5 nm.

Next, the present inventors examined the changes caused in the characteristics of a stack structure by an oxidation treatment performed on a laminated film obtained by stacking a magnetic film of FeCoB and a metallic magnesium film. Specifically, in a manner similar to the above described manner, a 1.5 nm thick magnetic film of FeCoB was formed on a silicon substrate provided with a thermally oxidized film, and a 1-nm thick metallic magnesium film was further formed. A plasma oxidation treatment was then performed on the laminated film. Furthermore, the electrical resistance and the saturation magnetization of the laminated film were measured.

The results of the above measurement are shown in FIG. 1. FIG. 1 is a graph showing the resistance ratio ($R/R_0$) and the saturation magnetization ratio ($M_s/M_{s0}$) of the laminated film with respect to the oxidation treatment time ($T_{Ox}$), as obtained through the examination conducted by the present inventors. Specifically, in FIG. 1, the abscissa axis indicates the oxidation treatment time ($T_{Ox}$), the ordinate axis on the left side indicates the resistance ratio ($R/R_0$), and the ordinate axis on the right side indicates the saturation magnetization ratio ($M_s/M_{s0}$). Note that the resistance ratio ($R/R_0$) and the saturation magnetization ratio ($M_s/M_{s0}$) are shown as the ratios to the resistance and saturation magnetization of the above laminated film prior to the oxidation treatment.

Figure 2:
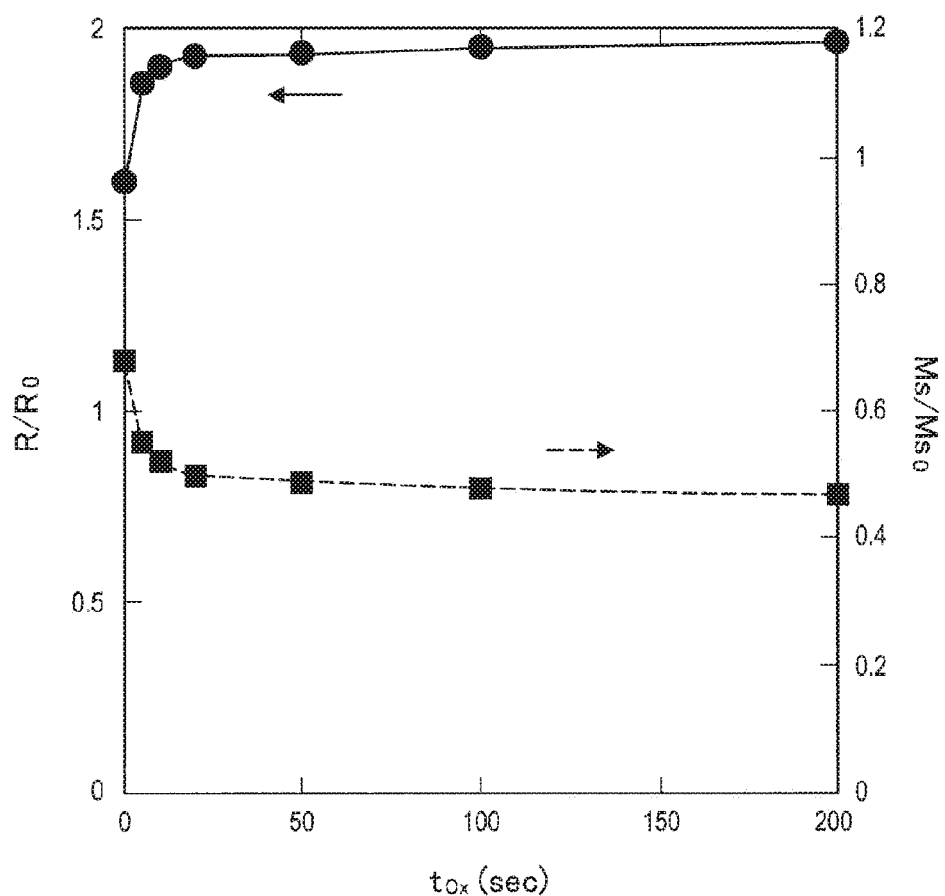
FIG. 2 is a graph (part 2) showing the resistance ratio ($R/R_0$) and the saturation magnetization ratio ($M_s/M_{s0}$) of a laminated film with respect to an oxidation treatment time ($T_{Ox}$), as obtained through examination conducted by the present inventors.

Further, the results of a case where heating was performed at 200° C. for 10 minutes prior to the above described oxidation treatment, and a similar oxidation treatment and measurement were then performed are shown in FIG. 2. FIG. 2 is a graph showing the resistance ratio ($R/R_0$) and the saturation magnetization ratio ($M_s/M_{s0}$) of the laminated film with respect to the oxidation treatment time ($T_{Ox}$), as obtained through the examination conducted by the present inventors. Note that the abscissa axis and the ordinate axis in FIG. 2 are similar to those in FIG. 1.

As shown in FIGS. 1 and 2, according to the present inventors, it became clear that, in a case where a metallic magnesium film was formed, an increase in the resistance ratio ($R/R_0$) and a decrease in the saturation magnetization ratio ($M_s/M_{s0}$) of the laminated film were observed, even if the oxidation treatment time ($T_{Ox}$) was short as compared with the case shown in FIG. 19. It was found that, as the oxidation treatment time was further extended, the changes in the resistance ratio ($R/R_0$) and the saturation magnetization ratio ($M_s/M_{s0}$) of the laminated film decreased. This is probably because the oxidation was accelerated even when the oxidation treatment time was short, and the magnetic film was insulated, since oxidation of a magnetic film is accelerated by laminating a metallic magnesium film. In addition, once an oxide film was formed on the surface of the magnetic film, the formed oxide film hindered ingress of oxygen into the magnetic film. Thus, the inside of the magnetic film was not oxidized, and changes in the resistance ratio ($R/R_0$) and the saturation magnetization ratio ($M_s/M_{s0}$) of the laminated film became smaller.

Further, as shown in FIG. 2, according to the present inventors, in a case where the laminated film is heated at 200° C. prior to the oxidation treatment, the resistance ratio ($R/R_0$) of the laminated film is much higher, and the saturation magnetization ratio ($M_s/M_{s0}$) is much lower than those shown in FIG. 1. This is probably because the magnetic film of FeCoB is easily oxidized after Mg and the magnetic transition metals of the FeCoB film are diffused and mixed by the heating prior to the oxidation treatment.

Next, to confirm the above described phenomenon, a stack structure similar to the above described stack structure was formed, and a cross-section of the stack structure was observed with a transmission electron microscope. The observed stack structure was obtained by forming a 5-nm thick film of tantalum (Ta) on a silicon substrate provided with a thermally oxidized film similar to the above described one, forming a 3.0 nm thick magnetic film of FeCoB, forming a 2-nm thick metallic magnesium film, further performing natural oxidation, and forming a 10-nm thick magnetic film of FeCoB thereon. An electron micrograph of the cross-section of the stack structure is shown on the left side in FIG. 3, and the element distribution of Fe, Mg, and Ta corresponding to the cross-section of the electron micrograph is shown on the right side in FIG. 3. Note that, in the element distribution in FIG. 3, the vertical direction in the drawing is the thickness direction of the sample, and the distribution amount becomes larger in the direction toward the right in the drawing.

Figure 3:
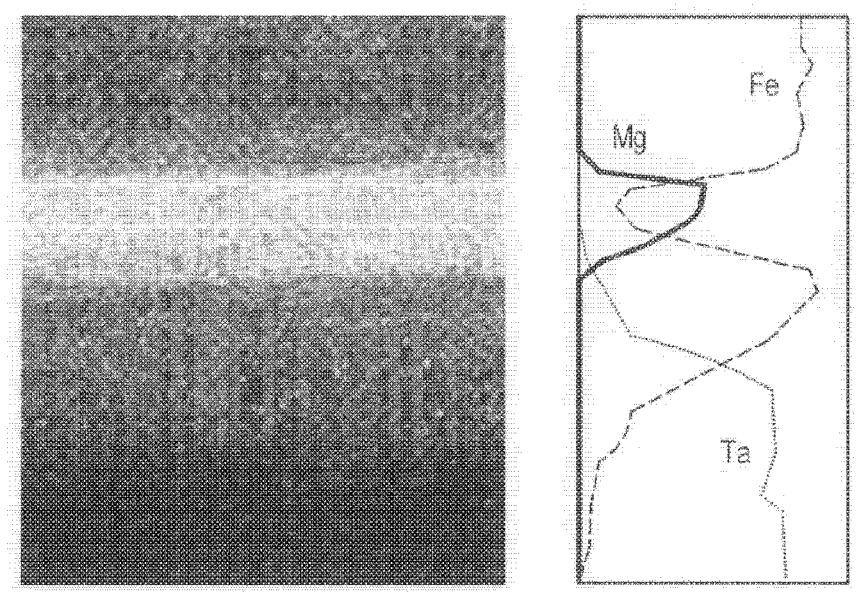
FIG. 3 shows an electron micrograph of a cross-section of a stack structure, and a graph showing the element distributions of Fe, Mg, and Ta corresponding to the cross-section of the micrograph.

In the microphotograph on the left side in FIG. 3, the whitish portion is the region containing magnesium as a principal component, but the distribution of magnesium shows a difference in tendency between the upper and lower interfaces. Specifically, the distribution of magnesium is gentler in the lower portion of the region containing magnesium as a principal component than in the upper portion of the region containing magnesium as a principal component. This is probably because the magnetic transition metals of the magnetic film of FeCoB and magnesium are diffused in the lower portion of the region containing magnesium as a principal component, and a composite oxide of these components is formed.

In other words, from the examination conducted by the present inventors, it became clear that an oxidation treatment is performed on a metallic magnesium film formed on a magnetic film, so that the oxidation is accelerated at the interface with the magnetic film in which magnesium is diffused, and the magnetic film is oxidized in a short time. Furthermore, once an oxide film is formed, ingress of oxygen into the magnetic film is prevented by the formed oxide film, and it becomes difficult to oxide the inside of the magnetic film. In view of this, the present inventors have developed an embodiment of the present disclosure that is capable of avoiding short-circuiting or the like and maintaining a high fabrication yield without affecting the characteristics of the MTJ element 90, by utilizing such a pro-oxidant effect of magnesium.

In other words, in the embodiment of the present disclosure described below, after an MTJ element is formed, a metallic magnesium film is formed on the side surfaces of the MTJ element, and an oxidation treatment is performed. With this arrangement, magnesium, which is easily oxidized, can mix with the magnetic transition metals contained in the re-adhering substance 920 and the etching residues 930 adhering to the side surfaces and the periphery of the MTJ element, and form a composite oxide film on the side surfaces of the MTJ element. In the embodiment described below, the composite oxide film is formed, so that the re-adhering substance 920 and the etching residues 930 adhering to the side surfaces and the periphery of the MTJ element can be oxidized and insulated, and short-circuiting in the MTJ element can be reduced. Further, since the composite oxide film can function as a protective layer that prevents oxygen from entering the inside of the MTJ element, changes in the magnetic characteristics of the MTJ element due to the oxidation treatment can also be reduced. In the description below, such an embodiment of the present disclosure is explained in detail.

«2. One Embodiment of the Present Disclosure»

<2.1. Structure of an MTJ element>

Figure 4:
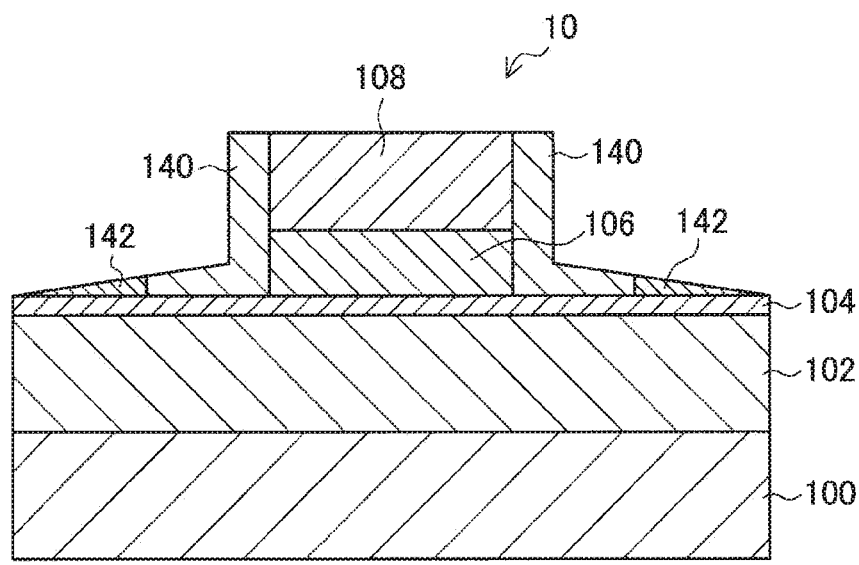
FIG. 4 is a cross-sectional view of an MTJ element 10 according to an embodiment of the present disclosure.

First, the structure of an MTJ element 10 according to an embodiment of the present disclosure is described in detail, with reference to FIG. 4. FIG. 4 is a cross-sectional view of the MTJ element 10 according to an embodiment of the present disclosure. FIG. 4 corresponds to a cross-section in a case where the MTJ element 10 is cut along the stacking direction of the stack structure of the MTJ element 10.

As shown in FIG. 4, the MTJ element (a ferromagnetic tunnel junction element) 10 according to this embodiment has a substrate 100 on which a first magnetic layer 902 and a tunnel barrier layer (an insulating layer) 104 are sequentially stacked. The MTJ element 10 further includes a second magnetic layer 106 that is disposed on the tunnel barrier layer (a first insulating layer) 104 and contains a magnetic transition metal, and a protective layer 108 disposed on the second magnetic layer 106. The MTJ element 10 also includes a first magnesium oxide film 140 that is provided to cover the side surfaces of the second magnetic layer 106 and the protective layer 108, and contains the above mentioned magnetic transition metal.

The substrate 100 is formed with a silicon substrate, for example.

The first magnetic layer 102 is formed with a magnetic film containing at least one element selected from the magnetic transition metal element group consisting of Fe, Co, Ni, and Mn. In other words, the first magnetic layer 102 is formed with a magnetic film containing Fe, Co, or Ni, which exhibits ferromagnetism at normal temperature, or Mn, which exhibits ferromagnetism in a case where an alloy or an intermetallic compound is formed. Alternatively, the magnetic film may contain at least one element selected between B and C. More specifically, the first magnetic layer 102 may be formed with a single material such as FeCoB, FeNiB, FeCoC, CoPt, FePt, CoMnSi, or MnAl, or may be formed with a combination of some of these materials. Meanwhile, the thickness of the first magnetic layer 102 is not smaller than 1 nm and not greater than 30 nm, for example.

The tunnel barrier layer 104 is a layer formed with an insulating material such as $Al_2O_3$ or MgO, and has a thickness not smaller than 0.3 nm and not greater than 5 nm, for example.

Like the first magnetic layer 102, the second magnetic layer 106 is also formed with a magnetic film containing at least one element selected from the magnetic transition metal element group consisting of Fe, Co, Ni, and Mn. Alternatively, the magnetic film may contain at least one element selected between B and C. More specifically, the first magnetic layer 102 may be formed with a single material such as FeCoB, FeNiB, FeCoC, CoPt, FePt, CoMnSi, or MnAl, or may be formed with a combination of some of these materials. Meanwhile, the thickness of the second magnetic layer 106 is not smaller than 1 nm and not greater than 10 nm, for example.

Note that the first magnetic layer 102 and the second magnetic layer 106 are magnetic layers that have different functions from each other in the MTJ element 10 to be formed. More specifically, in a case where the MTJ element 10 is used as a magnetic head, one of the first and second magnetic layers 102 and 106 is a pinned magnetization layer having a pinned magnetization direction, and the other one Is a free magnetization layer having magnetization that varies with an external magnetic field. Moreover, in a case where the MTJ element 10 is used as a magnetic memory, one of the first and second magnetic layers 102 and 106 is a pinned layer, and the other one is a storage layer. Note that, in this embodiment, the MTJ element 10 is not limited to such a configuration, and may have some other configuration. For example, the position of the first magnetic layer 102 and the position of the second magnetic layer 106 may be switched, and some other layer may be further included. Furthermore, each of the first and second magnetic layers 102 and 106 may be a single layer, or may have a stack structure in which a plurality of layers is stacked, and the stacked layers are magnetically coupled.

The protective layer 108 is formed with any of various appropriate metal materials, alloy materials, oxide materials, and the like. The protective layer 108 protects each stacked layer during the manufacture of the MTJ element 10, and may further function as a hard mask. The thickness of the protective layer 108 is not smaller than 0.5 nm and not greater than 50 nm, for example.

The first magnesium oxide film 140 is formed with a composite oxide whose principal components are at least one element of the magnetic transition metal element group (Fe, Co, Ni, and Mn) contained in the first and second magnetic layers 102 and 106, magnesium, and oxygen. The first magnesium oxide film 140 may also contain a light element such as B or C contained in the re-adhering substance 920, the etching residues 930, or the like. Even if such an element is contained in the first magnesium oxide film 140, short-circuiting is not caused in the MTJ element 10.

As shown in FIG. 4, the first magnesium oxide film 140 may be disposed so as to cover the upper surface of the tunnel barrier layer 104 located around the second magnetic layer 106.

Furthermore, as shown in FIG. 4, the MTJ element 10 according to this embodiment may further include a second magnesium oxide film 142 provided on the tunnel barrier layer 104 so as to surround the second magnetic layer 106. The second magnesium oxide film 142 is formed with an oxide containing magnesium and oxygen as principal components.

Further, although not shown in FIG. 4, an insulating layer may be provided between the second magnetic layer 106 and the protective layer 108. Furthermore, a foundation film (not shown) for controlling the crystalline orientation of the first magnetic layer 102 and enhancing the adhesion of the first magnetic layer 102 to the substrate 100 may be provided under the first magnetic layer 102.

Meanwhile, a plurality of the above described MTJ elements 10 may be provided in a matrix fashion on the substrate 100, and various wiring lines connected to the MTJ elements 10 may be further provided. Furthermore, an insulating film (a second insulating layer) may be buried between the MTJ elements 10 adjacent to each other among the plurality of MTJ elements 10.

Note that, although FIG. 4 shows the MTJ element 10 having a structure obtained by performing etching to reach the tunnel barrier layer 904, this embodiment is not limited to this. For example, a columnar MTJ element 10 having a structure obtained by performing etching to reach the first magnetic layer 902 may be formed. In this case, the first magnesium oxide film described above is only required to be provided on the side surfaces of the MTJ element 10. Furthermore, the first magnesium oxide film may be provided so as to cover the upper surface of the substrate 100 located around the first magnetic layer 102.

<2.2. Method of Manufacturing an MTJ Element>

Figure 5:
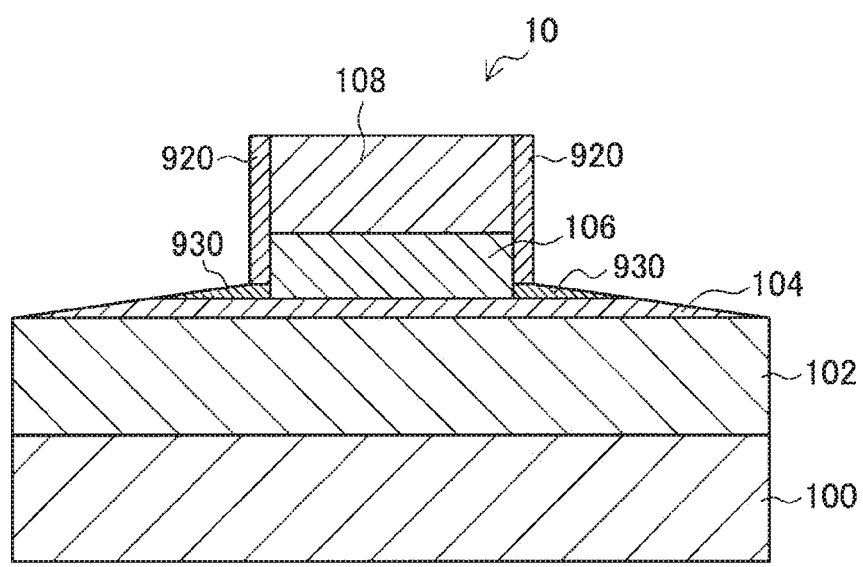
FIG. 5 is a cross-sectional view (part 1) for explaining each step in a method of manufacturing an MTJ element 10 according to an embodiment of the present disclosure.
Figure 6:
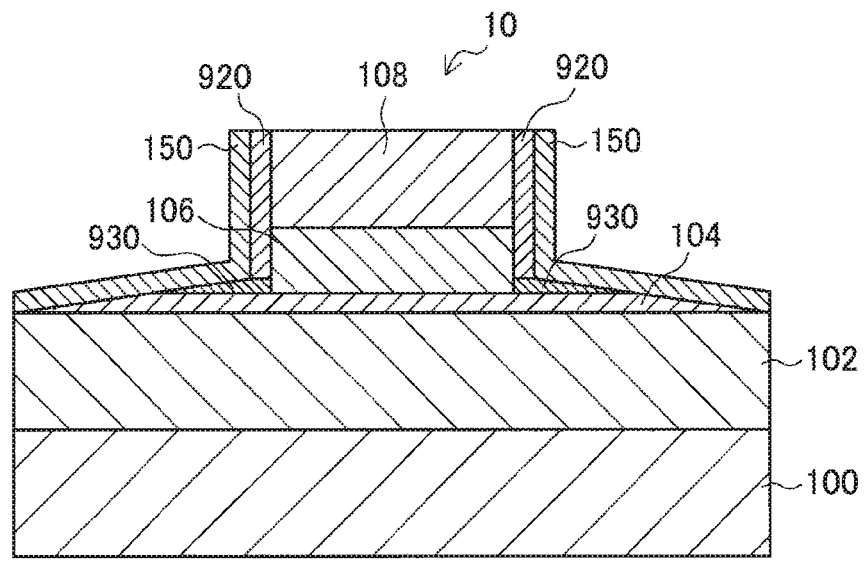
FIG. 6 is a cross-sectional view (part 2) for explaining each step in a method of manufacturing an MTJ element 10 according to an embodiment of the present disclosure.
Figure 7:
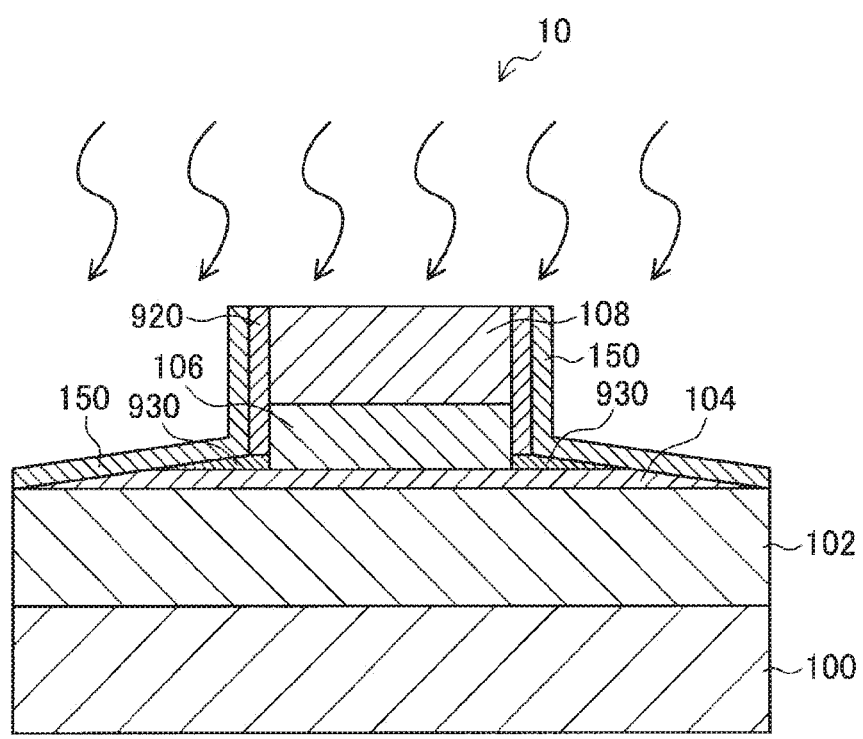
FIG. 7 is a cross-sectional view (part 3) for explaining each step in a method of manufacturing an MTJ element 10 according to an embodiment of the present disclosure.

Next, a method of manufacturing an MTJ element 10 according to the embodiment of the present disclosure shown in FIG. 4 is described, with reference to FIGS. 5 through 7. FIGS. 5 through 7 are cross-sectional views for explaining the respective steps in the method of manufacturing an MTJ element 10 according to the embodiment of the present disclosure, and specifically, correspond to the cross-sectional view shown in FIG. 4. Note that, in the example described below, a case where an MTJ element 10 having a structure obtained by performing etching to reach the tunnel barrier layer 104 in FIG. 4 is described as an example.

First, the first magnetic layer 102, the tunnel barrier layer 104, the second magnetic layer 106, and the protective layer 108 are sequentially stacked on the substrate 100, as in FIG. 12 described earlier. Next, a photomask having a pattern corresponding to the MTJ element 10 is formed on the protective layer 108, as in FIG. 13. Further, with the photomask being used as a mask, etching is performed on the protective layer 108, the second magnetic layer 106, and the tunnel barrier layer 104, to form a columnar MTJ element 10, as in FIG. 14. The etching may be ion beam etching (IBE), reactive ion etching (RIE), or a combination thereof, as described earlier.

In this manner, an MTJ element 10 in a state shown in FIG. 5 is obtained. As shown in FIG. 5, the re-adhering substance 920 and the etching residues 930 resulting from the processing performed so far adhere to the periphery of the MTJ element 10.

A metallic magnesium film 150 is formed to cover the side surfaces of the MTJ element 10 in the state shown in FIG. 5. Alternatively, the metallic magnesium film 150 may also be formed to cover the portion of the upper surface of the tunnel barrier layer 104 located around the second magnetic layer 106 of the MTJ element 10. At this stage, the thickness of the metallic magnesium film 150 is preferably not smaller than 0.5 nm and not greater than 5 nm. If the thickness of the metallic magnesium film 150 is smaller than 0.5 nm, the effect to accelerate oxidation of the re-adhering substance 920 and the etching residues 930 is limited. Further, in a case where the thickness of the metallic magnesium film 150 is greater than 5 nm, only the surface portion of the metallic magnesium film 150 might be oxidized, and the inside thereof might not be sufficiently oxidized. In such a case, the non-oxidized metallic magnesium film 150 may cause short-circuiting in the MTJ element 10.

The metallic magnesium film 150 can be formed by a sputtering method, an ion beam method, a vapor deposition method, a chemical vapor deposition (CVD) method, or the like. The metallic magnesium film 150 is not necessarily formed as a uniform film, but is preferably formed so that magnesium diffuses from the metallic magnesium film 150, and is mixed with a magnetic transition metal (Fe, Co, Ni, or Mn) from the re-adhering substance 920 and the etching residues 930. Accordingly, the region in which magnesium is mixed with the magnetic transition metal of the re-adhering substance 920 and the etching residues 930 is the formation region of the first magnesium oxide film 140. Because of this, it is possible to control the formation region and the thickness of the first magnesium oxide film 140 by controlling the diffusion of magnesium.

Therefore, in a case where the metallic magnesium film 150 is formed by a sputtering method, it is preferable to appropriately select conditions such as the pressure of the gas and the substrate bias for the film formation so that magnesium will flow and diffuse into a desired region. Alternatively, in a case where the metallic magnesium film 150 is formed by an ion beam method, the conditions such as the incident energy and the incident angle of magnesium are appropriately selected so that magnesium is accurately positioned in a desired region (desired width and depth).

Further, a heat treatment for diffusing magnesium may be performed during or after the formation of the metallic magnesium film 150, or during the oxidation treatment described later. The heat treatment temperature is preferably not lower than 100° C. and not higher than 300° C. If the heat treatment temperature is lower than 100° C., the diffusion of magnesium becomes insufficient. If the heat treatment temperature is higher than 300° C., magnesium diffuses deep into the inside of the MTJ element 10.

Next, an oxidation treatment is performed on the metallic magnesium film 150, as shown in FIG. 7. The oxidation treatment may be performed through plasma oxidation or natural oxidation. Alternatively, the metallic magnesium film 150 may be exposed to the air after the formation thereof, so that the metallic magnesium film 150 is oxidized. Furthermore, in a case where the protective layer 108 is formed with an oxide material, the metallic magnesium film 150 may be oxidized by taking in oxygen from the protective layer 108. Through the oxidation treatment, not only the metallic magnesium film 150 is oxidized, but also the re-adhering substance 920 and the etching residues 930 are oxidized by virtue of the pro-oxidant effect of magnesium.

By the manufacturing method according to this embodiment, the MTJ element 10 shown in FIG. 4 can be obtained in the above manner. In other words, it is possible to obtain the MTJ element 10 that includes the first magnesium oxide film 140 provided so as to cover the side surfaces of the second magnetic layer 106 and the protective layer 108. Being a film obtained by oxidizing the re-adhering substance 920 and the etching residues 930 together with magnesium, the first magnesium oxide film 140 contains magnetic transition metals such as Fe, Co, Ni, and Mn contained in the re-adhering substance 920, the etching residues 930, and the like, and magnesium. Further, the first magnesium oxide film 140 may also contain a light element such as B or C contained in the re-adhering substance 920, the etching residues 930, and the like. Such an element contained in the first magnesium oxide film 140 does not cause short-circuiting in the MTJ element 10. As the first magnesium oxide film 140 is formed in this manner, the re-adhering substance 920 and the etching residues 930 are oxidized and insulated, and thus, short-circuiting in the MTJ element 10 can be prevented. Furthermore, once the first magnesium oxide film 140 is formed in the above described oxidation treatment, the formed first magnesium oxide film 140 functions as a protective film, and can prevent the first and second magnetic layers 102 and 106, the tunnel barrier layer 104, and the like in the MTJ element 10 from being oxidized by the above oxidation treatment. As a result, it becomes difficult to oxidize the first and second magnetic layers 102 and 106 and the like of the MTJ element 10. Thus, it is possible to avoid changes in the magnetic characteristics of the MTJ element 10 due to the above oxidation treatment.

In addition, after that, an insulating film (the second insulating layer) (not shown) formed with an oxide material may be buried between MTJ elements 10 adjacent to each other among the plurality of MTJ elements 10 provided on the substrate 100. At this stage, the above mentioned insulating film may be formed after the etching is performed on the first magnesium oxide film 140. However, the insulating film is preferably formed while all or part of the first magnesium oxide film 140 is left as it is. This is because, as the first magnesium oxide film 140 functions as a protective film and can prevent oxidation of the second magnetic layer 106 and the like in the MTJ element 10, the magnetic characteristics of the MTJ element 10 can be prevented from changing due to the oxidation treatment at the time of the formation of the insulating film.

«3. Summary»

As described above, in this embodiment, after the MTJ element 10 is formed, the metallic magnesium film 150 is formed on the side surfaces of the MTJ element 10, and an oxidation treatment is performed. In this manner, while diffusing from the metallic magnesium film 150, magnesium is mixed with the magnetic transition metals (Fe, Co, Ni, and Mn) contained in the re-adhering substance 920, the etching residues 930, and the like existing on the side surfaces and the like of the MTJ element 10, and is oxidized. As a result, the first magnesium oxide film 140, which is a composite oxide film of magnesium and a magnetic transition metal, is formed to cover the side surfaces of the MTJ element 10. According to this embodiment, such the first magnesium oxide film 140 is formed to insulate the re-adhering substance 920 and the etching residues 930 adhering to the side surfaces and the like of the MTJ element 10, and thus, short-circuiting in the MTJ element 10 can be reduced. As a result, according to this embodiment, it is possible to maintain a high fabrication yield. Further, the first magnesium oxide film 140 can function as a protective layer that prevents oxygen from entering the first and second magnetic layers 102 and 106, the tunnel barrier layer 104, and the like that constitute the MTJ element 10. Thus, according to this embodiment, it is possible to reduce changes in the characteristics of the MTJ element 10 due to the oxidation treatment.

Furthermore, in this embodiment, the metallic magnesium film 150 is formed and is subjected to the oxidation treatment, so that the first magnesium oxide film 140 is formed. Accordingly, the number of steps in manufacturing the MTJ element 10 does not increase. Thus, according to this embodiment, it is possible to avoid a significant increase in the production cost. Further, the first magnesium oxide film 140 is not a protective film having a two-layer structure described above in Patent Document 2. Accordingly, it is possible to reduce the increase in the area occupied by the MTJ element 10 on the substrate, and avoid a decrease in the storage capacity per unit area.

Note that the magnetic layers of the MTJ element 10 according to the embodiment of the present disclosure may be perpendicular magnetization films or in-plane magnetization films.

Meanwhile, a storage device (MRAM) including the MTJ element 10 according to this embodiment may be mounted together with a semiconductor circuit functioning as an arithmetic device or the like on the same semiconductor chip, to form a semiconductor device (system-on-a-chip: SoC). Further, a storage device according to this embodiment may be mounted on any kind of electric device into which a storage device can be installed. For example, the storage device may be installed as a temporary memory or a storage into any kind of electronic device, such as a mobile device (a smartphone, a tablet personal computer (PC), or the like), a notebook PC, a wearable device, a game device, a music device, a video device, or a digital camera.

Further, although the MTJ element 10 according to an embodiment of the present disclosure has been described as a magnetic storage element in a storage device (MRAM), the MTJ element 10 is not necessarily applied to such a storage device. For example, the MTJ element 10 can be applied to a magnetic head, a hard disk drive equipped with the magnetic head, and a magnetic sensor device.

«4. Examples»

An embodiment of the present disclosure has been described in detail so far. Next, specific examples of the embodiment of the present disclosure are described in greater detail. Note that the examples described below are mere examples of the embodiment of the present disclosure, and the embodiment of the present disclosure is not limited by the following examples.

Example 1

Figure 8:
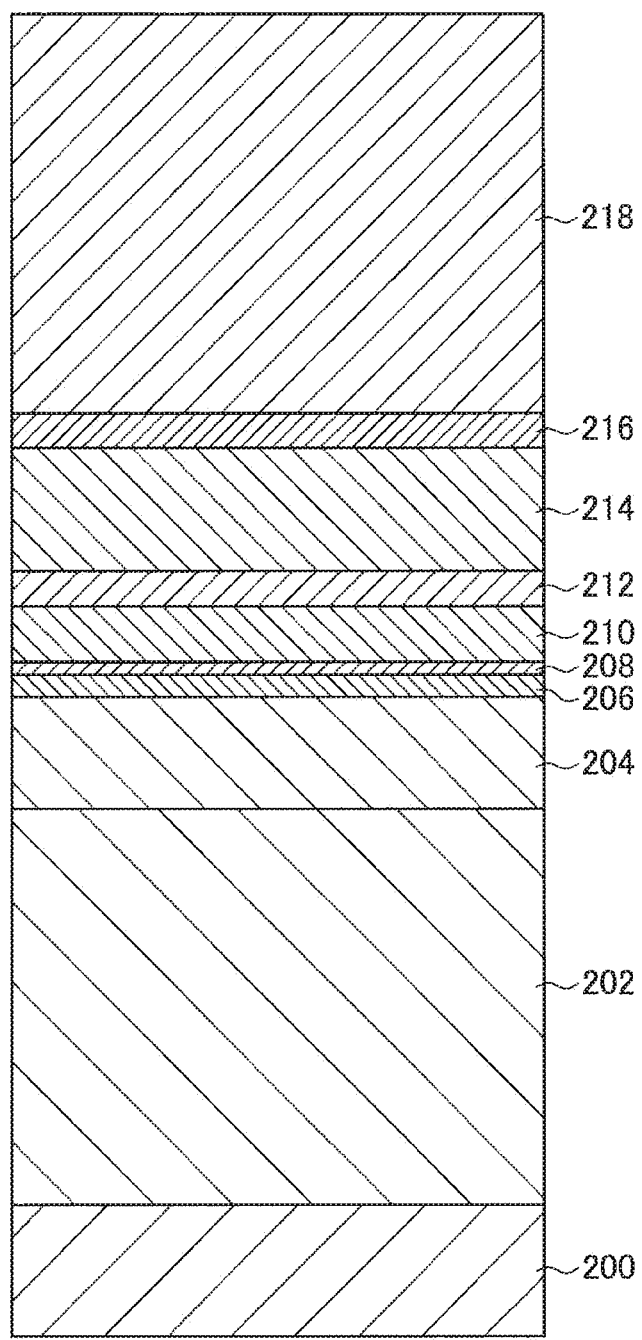
FIG. 8 is a cross-sectional view in one step for an MTJ element 10 according to Example 1.

Referring to FIG. 8, Example 1 is first described. FIG. 8 is a cross-sectional view in one step for an MTJ element 10 according to Example 1. The MTJ element according to Example 1 corresponds to the MTJ element 10 shown in FIG. 4.

As shown in FIG. 8, a foundation layer 202 was first formed with a laminated film of Ta (5 nm in thickness) and ruthenium (Ru) (2 nm in thickness) on a substrate 200. Next, a pinned magnetization layer 204 was formed with CoPt (2 nm in thickness), a magnetization coupling layer 206 was formed with Ru (0.5 nm in thickness), a magnetization coupling layer 208 was formed with tungsten (W) (0.2 nm in thickness), a reference magnetization layer 210 was formed with FeCoB (1 nm in thickness), and a tunnel barrier layer 212 was formed with MgO (0.7 nm in thickness).

Further, as shown in FIG. 8, a storage layer 214 was formed with a laminated film of FeCoB (1.0 nm in thickness), Ta (0.2 nm in thickness), and FeCoB (1.0 nm in thickness), and a spin barrier layer 216 was formed with MgO (0.6 nm in thickness). A protective layer 218 was then formed with a laminated film of Ru (2 nm in thickness) and Ta (5 nm in thickness).

Note that the pinned magnetization layer 204, the magnetization coupling layers 206 and 208, and the reference magnetization layer 210 in FIG. 8 correspond to the first magnetic layer 102 in FIG. 4 described above, and the storage layer 214 in FIG. 8 corresponds to the second magnetic layer 106 in FIG. 4.

Next, a one-hour heat treatment at 400° C. was performed on this stack structure. Further, the stack structure was processed into a cylindrical shape having a diameter of 50 nm by ion milling, to have the shape of an MTJ element. Note that the ion milling was etching performed to reach the tunnel barrier layer 212.

After the processing of the MTJ element, a metallic magnesium film (1 nm in thickness) was then formed by a sputtering method, and a 10-minute heat treatment at 200° C. was further performed, followed by natural oxidation in the air. Further, a protective film ($SiO_2$) and an electrode not shown in FIG. 8 were formed. In this manner, the MTJ element according to Example 1 was formed.

Example 2

Next, Example 2 is described. Example 2 is similar to Example 1, except that etching was performed to reach the storage layer 214 at the time of processing of the MTJ element, and the metallic magnesium film had thicknesses of 0.5 nm, 1 nm, 3 nm, 5 nm, and 10 nm.

Example 3

Next, Example 3 is described. Example 3 is similar to Example 1, except that etching was performed to reach the storage layer 214 at the time of processing of the MTJ element, the metallic magnesium film had a thickness of 2.0 nm, and further, the temperatures of the heat treatment after the formation of the metallic magnesium film were 0° C. (without heating), 100° C., 200° C., 300° C., and 400° C.

Comparative Example 1

Next, Comparative Example 1 is described. In Comparative Example 1, the stack structure shown in FIG. 8 was formed, a one-hour heat treatment at 400° C. was performed, and the stack structure was processed by ion milling into a cylindrical shape having a diameter of 50 nm, as in Example 1. Thus, the shape of an MTJ element was formed. Note that the ion milling was etching performed to reach the tunnel barrier layer 212. Further, a protective film ($SiO_2$) and an electrode were formed. In this manner, the MTJ element according to Comparative Example 1 was formed.

Comparative Example 2

Next, Comparative Example 2 is described. In Comparative Example 2, MTJ element processing was performed, as in Example 1. Next, after the MTJ element processing, plasma oxidation was performed, and a protective film ($SiO_2$) and an electrode were then formed. In this manner, the MTJ element according to Comparative Example 2 was formed.

Comparative Example 3

Next, Comparative Example 3 is described. In Comparative Example 3, MTJ element processing was performed, as in Example 1. After the processing of the MTJ element, a metallic magnesium film 220 (1 nm in thickness) was then formed by a sputtering method, and a 10-minute heat treatment at 200° C. was further performed, followed by natural oxidation in the air, as in Example 1. Further, after the oxide formed by the natural oxidation was removed by ion milling, a protective film ($SiO_2$) and an electrode were formed. In this manner, the MTJ element according to Comparative Example 3 was formed.

Comparative Example 4

Next, Comparative Example 4 is described. The comparative Example 4 is similar to Comparative Example 1, except that etching was performed to reach the storage layer 214 at the time of the processing of the MTJ element.

The short-circuiting occurrence rates, the magnetoresistance ratios (MR), the coercive forces (Hc), and the turnover voltage (Vc) of the respective MTJ elements according to Comparative Example 1, Comparative Example 2, and Example 1 were then measured. The results obtained by carrying out the measurement are shown in Table 1 below. Note that the coercive forces (Hc) and the turnover voltages (Vc) were measured with a VSM.

TABLE 1

| | Comparative Example 1 | Comparative Example 2 | Example 1 |
| --- | --- | --- | --- |
| Short-Circuiting Rate (%) | 3.2 | 0 | 0 |
| MR (%) | 96 | 113 | 122 |
| Hc (Oe) | 1860 | 2430 | 2360 |
| Vc (V) | 0.43 | 0.76 | 0.41 |

As can be seen from Table 1, in the MTJ element according to Comparative Example 1 in which any oxidation treatment was not performed, the short-circuiting occurrence rate is high, supposedly because the re-adhering substance 920 and the etching residues 930 remain without being insulated. Further, in Comparative Example 1, both the magnetoresistance ratio (MR) and the coercive force (Hc) have low values. Meanwhile, in the MTJ element according to Comparative Example 2 in which the oxidation treatment was performed, the short-circuiting occurrence rate is low, and accordingly, it is considered that the re-adhering substance 920 and the etching residues 930 are insulated. However, in Comparative Example 2, both the magnetoresistance ratio (MR) and the coercive force (Hc) increased, but the turnover voltage (Vc) significantly increased. This is supposedly because oxygen entered the magnetic layers and the like of the MTJ element according to the comparative example, due to the oxidation treatment. On the other hand, in the MTJ element according to Example 1, there is no increase in the turnover voltage (Vc), and the short-circuiting occurrence rate, the magnetoresistance ratio (MR), and the coercive force (Hc) were improved. In other words, in the MTJ element according to Example 1 in which the first magnesium oxide film of this embodiment was formed, degradation of the magnetic characteristics of the MTJ element due to the oxidation process is reduced, while the occurrence rate of short-circuiting due to the oxidation treatment is lowered.

Figure 9:
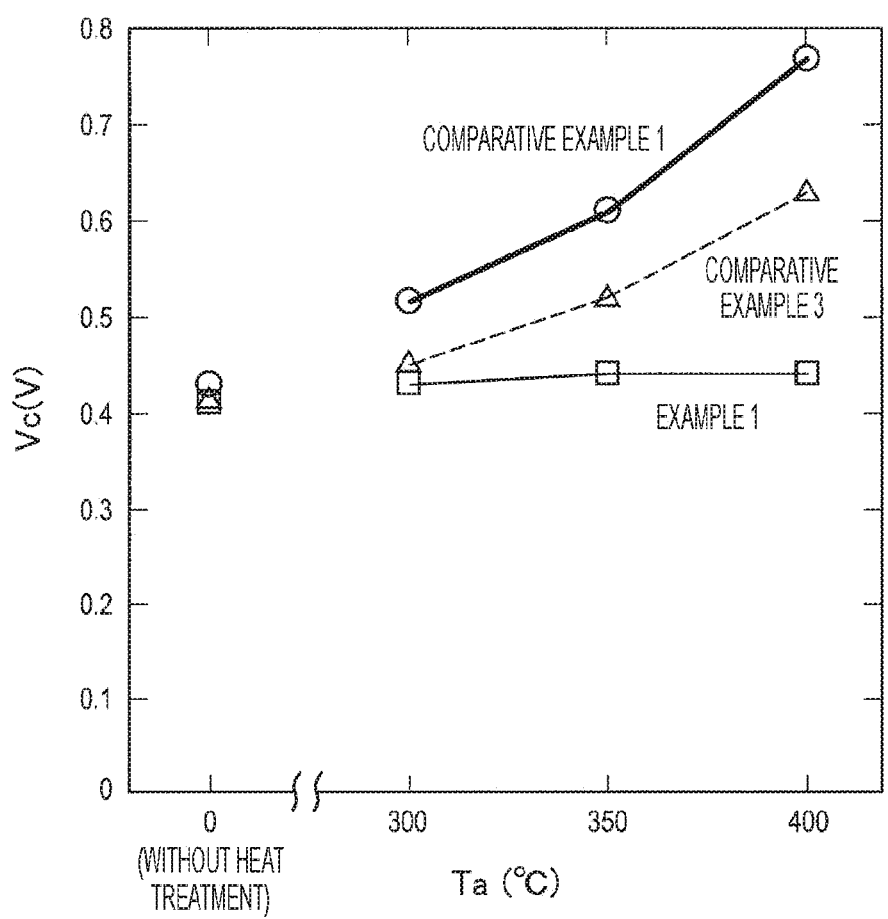
FIG. 9 is a graph showing the changes in the turnover voltage (Vc) with respect to the heat treatment temperature (Ta) in a case where MTJ elements according to Comparative Example 1, Comparative Example 3, and Example 1 were heated at 300° C. to 400° C. for one hour.

Next, changes in the turnover voltage (Vc) in a case where the MTJ elements according to Comparative Example 1, Comparative Example 3, and Example 1 were heated at 300° C. to 400° C. for one hour are described, with reference to FIG. 9. FIG. 9 is a graph showing the changes in the turnover voltage (Vc) with respect to the heat treatment temperature (Ta) in the case where the MTJ elements according to Comparative Example 1, Comparative Example 3, and Example 1 were heated at 300° C. to 400° C. for one hour. Specifically, in FIG. 9, the abscissa axis indicates the heat treatment temperature (Ta), and the ordinate axis indicates the turnover voltage (Vc).

As shown in FIG. 9, the turnover voltages (Vc) of the MTJ elements according to Comparative Example 1 and Comparative Example 3 significantly increased with an increase in the heat treatment temperature (Ta). On the other hand, in the MTJ element according to Example 1, even when the heat treatment temperature (Ta) rose, the turnover voltage (Vc) was almost constant, and did not increase. This is supposedly because the MTJ element according to Example 1 had the first magnesium oxide film as a protective film. By virtue of the first magnesium oxide film, oxygen did not enter the magnetic layers and the like of the MTJ element even when the heat treatment was performed, and the characteristics of the magnetic layers and the like did not change. On the other hand, in the MTJ element according to Comparative Example 1, any magnesium oxide film was not formed in the first place. In the MTJ element according to Comparative Example 3, the magnesium oxide film temporarily formed was removed, and there is not a film that functions as a protective film. Since the protective film was not provided in Comparative Examples 1 and 3, oxygen entered the magnetic layers and the like of the MTJ elements when the heat treatment was performed, and changes were caused in the characteristics of the magnetic layers and the like. This is considered the reason that the above described results were obtained.

In other words, since the ingress of oxygen or the like into the magnetic layers and the tunnel barrier layer of an MTJ element is the cause of the increase in the turnover voltage (Vc), the first magnesium oxide film according to this embodiment is kept, so that ingress of oxygen or the like into the magnetic layers and the tunnel barrier layer constituting the MTJ element can be prevented, and an increase in the turnover voltage (Vc) can be avoided. Therefore, in an MTJ element according to this embodiment, it is preferable not to remove but to keep the first magnesium oxide film obtained through oxidation of a metallic magnesium film, as a protective film.

Figure 10:
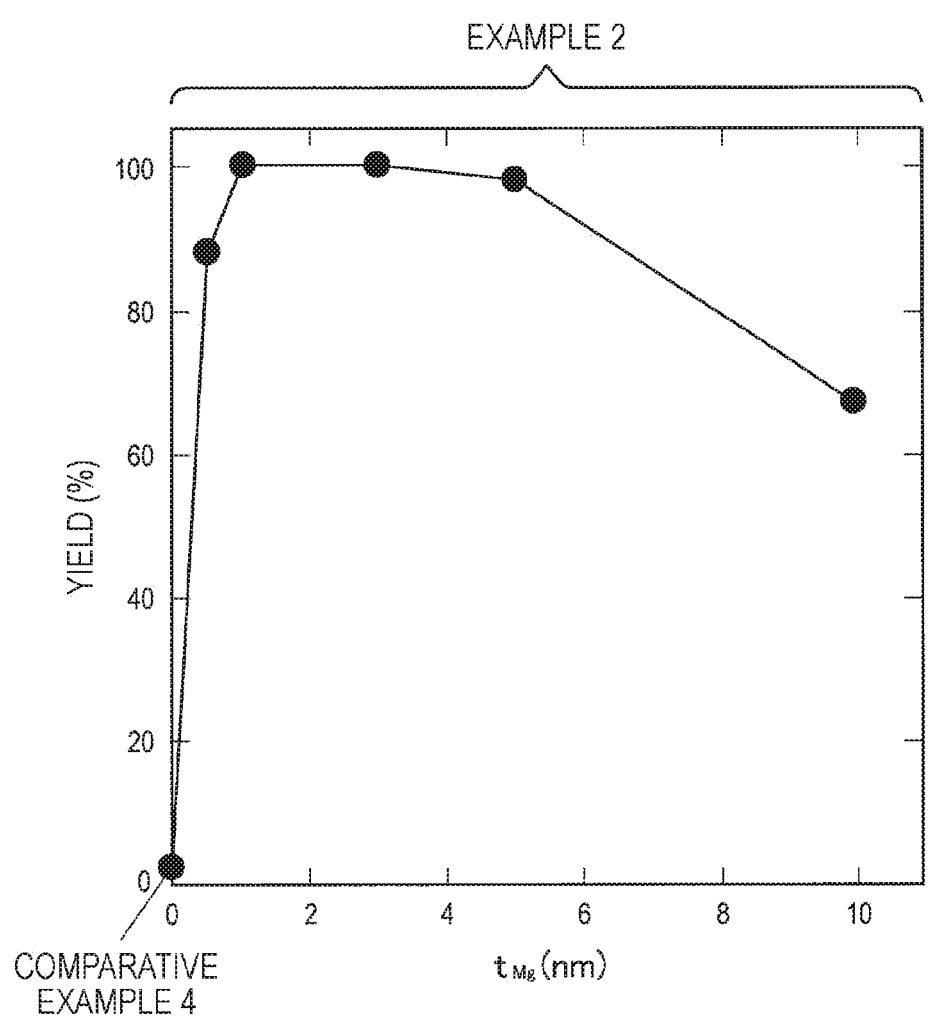
FIG. 10 is a graph showing the changes in yield with respect to the thickness ($t_{Mg}$) of a metallic magnesium film in each of MTJ elements according to Comparative Example 4 and Example 2.

Next, evaluation was performed on the MTJ element according to Example 2 and the MTJ element according to Comparative Example 4 in a case where etching was performed to reach the storage layer 214 at the time of MTJ element processing. The MTJ element according to Example 2 and the MTJ element according to Comparative Example 4 obtained as described above were subjected to a heat treatment at 400° C. for 1 hour, and the turnover voltages were measured. In addition, the yield results obtained in a case where an MTJ element having a turnover voltage equal to or lower than 0.5 V was regarded as a preferable product are shown in FIG. 10. FIG. 10 is a graph showing the changes in yield with respect to the thickness ($t_{Mg}$) of the metallic magnesium film in each of the MTJ elements according to Comparative Example 4 and Example 2. Specifically, in FIG. 10, the abscissa axis indicates the thickness ($t_{Mg}$) of the metallic magnesium film, and the ordinate indicates the yield.

In FIG. 10, the case where the thickness ($t_{Mg}$) of the metallic magnesium film is 0 nm corresponds the result of the evaluation of the MTJ element according to Comparative Example 4, and the case where the thickness ($t_{Mg}$) of the metallic magnesium film is 0.5 nm to 10 nm corresponds to the result of the evaluation of the MTJ element according to Example 2. As shown in FIG. 10, the yield of the MTJ element according to Example 2 in which the metallic magnesium film was formed is higher than the yield of the MTJ element according to Comparative Example 4 in which the metallic magnesium film was not formed. Further, in a case where the thickness ($t_{Mg}$) of the metallic magnesium film was not smaller than 0.5 nm and not greater than 5 nm, the yield was particularly preferable. Thus, it became clear that it is preferable to form the metallic magnesium film so as to have a thickness that is not smaller than 0.5 nm and not greater than 5 nm.

Figure 11:
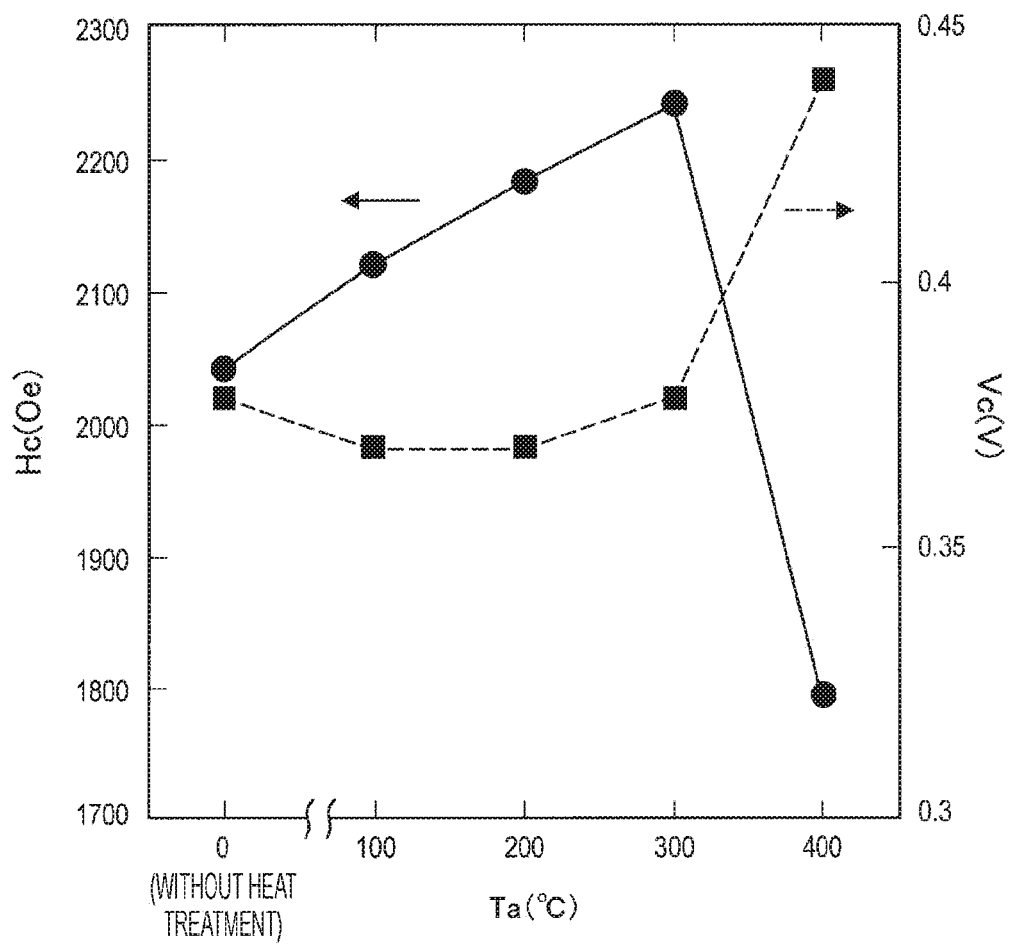
FIG. 11 is a graph showing the changes in the characteristics of an MTJ element with respect to the heat treatment temperature (Ta) in the MTJ element according to Example 3.

Next, the influence of the heating temperature in the heat treatment after the formation of the metallic magnesium film was examined. The results are shown in FIG. 11. FIG. 11 is a graph showing the changes in the characteristics of the MTJ element with respect to the heat treatment temperature (Ta) in the MTJ element according to Example 3. Specifically, in FIG. 11, the abscissa axis indicates the heat treatment temperature (Ta), the ordinate axis on the right side indicates the coercive force (Hc), and the ordinate axis on the left side indicates the turnover voltage (Vc).

As shown in FIG. 11, in a case where a heat treatment was performed on the MTJ element according to Example 3, the turnover voltage (Vc) hardly changed until 300° C. even though the heat treatment temperature (Ta) increased. Meanwhile, the coercive force (Hc) increased. Further, when the heat treatment temperature (Ta) exceeded 300° C., the turnover voltage (Vc) sharply increased, while the coercive force (Hc) rapidly decreased. From these facts, it became clear that, in a case where a heat treatment is performed after the formation of the metallic magnesium film, the heat treatment temperature (Ta) is preferably set at 300° C. or lower, to avoid an increase in the turnover voltage (Vc) and a decrease in the coercive force (Hc).

《5. Supplemental Remarks》

While a preferred embodiment of the present disclosure has been described above with reference to the accompanying drawings, the technical scope of the present disclosure is not limited to this example. It is apparent that those who have ordinary skills in the technical field of the present disclosure can make various changes or modifications within the scope of the technical spirit claimed herein, and it should be understood that those changes or modifications are within the technical scope of the present disclosure.

Furthermore, the effects disclosed in the present specification are merely illustrative or exemplary, and are not restrictive. That is, the technology according to the present disclosure may exhibit other effects obvious to those skilled in the art from the description in the present specification, in addition to or instead of the effects described above.

Note that the configurations described below are also within the technical scope of the present disclosure.

(1)

A ferromagnetic tunnel junction element including:

a first magnetic layer;

a first insulating layer disposed on the first magnetic layer;

a second magnetic layer containing a magnetic transition metal, the second magnetic layer being disposed on the first insulating layer; and a magnesium oxide film containing the magnetic transition metal, the magnesium oxide film being disposed to cover a side surface of the second magnetic layer.

(2)

The ferromagnetic tunnel junction element according to (1), in which the magnesium oxide film is formed with a composite oxide containing the magnetic transition metal, magnesium, and oxygen as principal components.

(3)

The ferromagnetic tunnel junction element according to (1) or (2), in which the magnesium oxide film covers an upper surface of the first insulating layer, the upper surface being located around the second magnetic layer.

(4)

The ferromagnetic tunnel junction element according to any one of (1) to (3), in which the magnetic transition metal is at least one element selected from the element group consisting of Fe, Co, Ni, and Mn.

(5)

The ferromagnetic tunnel junction element according to any one of (1) to (4), including a plurality of the ferromagnetic tunnel junction elements, in which a second insulating layer is buried between the ferromagnetic tunnel junction elements adjacent to each other.

(6)

A method of manufacturing a ferromagnetic tunnel junction element, the method including:

sequentially stacking a first magnetic layer, a first insulating layer, and a second magnetic layer containing a magnetic transition metal on a substrate;

forming a plurality of columnar ferromagnetic tunnel junction elements by performing etching on the second magnetic layer;

forming a metallic magnesium film on a side surface of the second magnetic layer; and forming a magnesium oxide film containing the magnetic transition metal by performing an oxidation treatment to oxidize the metallic magnesium film, the magnesium oxide film covering the side surface of the second magnetic layer.

(7)

The method of manufacturing a ferromagnetic tunnel junction element according to (6), in which the magnesium oxide film is formed with a composite oxide containing the magnetic transition metal, magnesium, and oxygen as principal components.

(8)

The method of manufacturing a ferromagnetic tunnel junction element according to (6) or (7), in which the magnetic transition metal is at least one element selected from the element group consisting of Fe, Co, Ni, and Mn.

(9)

The method of manufacturing a ferromagnetic tunnel junction element according to any one of (6) and (8), in which the metallic magnesium film is formed to cover an upper surface of the first insulating layer, the upper surface being located around the second magnetic layer.

(10)

The method of manufacturing a ferromagnetic tunnel junction element according to any one of (6) to (9), in which the metallic magnesium film is formed to have a thickness of not smaller than 0.5 nm and not greater than 5 nm.

(11)

The method of manufacturing a ferromagnetic tunnel junction element according to any one of (6) to (10), in which the metallic magnesium film is formed by an ion beam method.

(12)

The method of manufacturing a ferromagnetic tunnel junction element according to any one of (6) to (10), in which the metallic magnesium film is formed by a sputtering method.

(13)

The method of manufacturing a ferromagnetic tunnel junction element according to any one of (6) to (12), further including performing a heat treatment at a temperature not lower than 100° C. and not higher than 300° C.

(14)

The method of manufacturing a ferromagnetic tunnel junction element according to any one of (6) to (13), further including burying a second insulating layer between the ferromagnetic tunnel junction elements adjacent to each other, after the oxidation treatment.

REFERENCE SIGNS LIST 10, 90 MTJ element
100, 200, 900 Substrate
102, 902 First magnetic layer
104, 212, 904 Tunnel barrier layer
106, 906 Second magnetic layer
108, 218, 908 Protective layer
140 First magnesium oxide film
142 Second magnesium oxide film
150 Metallic magnesium film
204 Pinned magnetization layer
206, 208 Magnetization coupling layer
210 Reference magnetization layer
214 Storage layer
216 Spin barrier layer
910 Photomask
920 Re-adhering substance
930 Etching residues

The invention claimed is:

1. A ferromagnetic tunnel junction element, comprising:
a first magnetic layer;
a first insulating layer on the first magnetic layer;
a second magnetic layer containing a magnetic transition metal, wherein the second magnetic layer is on the first insulating layer; and
a first magnesium oxide film consisting essentially of a composite oxide containing the magnetic transition metal, magnesium, and oxygen, wherein
the magnetic transition metal is at least one element selected from an element group consisting of Iron (Fe), Cobalt (Co), Nickel (Ni) and Manganese (Mn),
the first magnesium oxide film covers a side surface of the second magnetic layer, and
a material of the first magnesium oxide film is different from a material of the first insulating layer.

2. The ferromagnetic tunnel junction element according to claim 1, wherein
the first magnesium oxide film further covers a portion of an upper surface of the first insulating layer, and
the portion of the upper surface of the first insulating layer surrounds the second magnetic layer.

3. The ferromagnetic tunnel junction element according to claim 1, further comprising a second insulating layer, wherein
the second insulating layer is between adjacent ferromagnetic tunnel junction elements of a plurality of ferromagnetic tunnel junction elements, and
the plurality of the ferromagnetic tunnel junction elements includes the ferromagnetic tunnel junction element.

4. The ferromagnetic tunnel junction element according to claim 1, further comprising a second magnesium oxide film that includes an oxide containing magnesium and oxygen, wherein the second magnesium oxide film is on the first insulating layer at a periphery of the first magnesium oxide film.

5. A method of manufacturing a ferromagnetic tunnel junction element, the method comprising:
sequentially stacking a first magnetic layer, a first insulating layer, and a second magnetic layer on a substrate, wherein the second magnetic layer contains a magnetic transition metal;
forming a plurality of columnar ferromagnetic tunnel junction elements by performing etching on the second magnetic layer;
forming a metallic magnesium film on a side surface of the second magnetic layer; and
forming a first magnesium oxide film by performing an oxidation treatment to oxidize the metallic magnesium film, wherein
the first magnesium oxide film consisting essentially of a composite oxide containing the magnetic transition metal, magnesium, and oxygen, the
magnetic transition metal is at least one element selected from an element group consisting of Iron (Fe), Cobalt (Co), Nickel (Ni) and Manganese (Mn), the first magnesium oxide film covers the side surface of the second magnetic layer, and a material of the first magnesium oxide film is different from a material of the first insulating layer.

6. The method of manufacturing the ferromagnetic tunnel junction element according to claim 5, wherein the metallic magnesium film covers a portion of an upper surface of the first insulating layer, and the portion of the upper surface surrounds the second magnetic layer.

7. The method of manufacturing the ferromagnetic tunnel junction element according to claim 5, wherein the metallic magnesium film has a thickness in a range between 0.5 nm and 5 nm.

8. The method of manufacturing the ferromagnetic tunnel junction element according to claim 5, further comprising forming the metallic magnesium film by an ion beam method.

9. The method of manufacturing the ferromagnetic tunnel junction element according to claim 5, further comprising forming the metallic magnesium film by a sputtering method.

10. The method of manufacturing the ferromagnetic tunnel junction element according to claim 5, further comprising performing a heat treatment at a temperature in a range between 100° C. and 300° C.

11. The method of manufacturing the ferromagnetic tunnel junction element according to claim 5, further comprising burying, after the oxidation treatment, a second insulating layer between adjacent ferromagnetic tunnel junction elements of the plurality of columnar ferromagnetic tunnel junction elements.

* * * * *